(12) United States Patent
Arai

(10) Patent No.: US 11,515,327 B2
(45) Date of Patent: Nov. 29, 2022

(54) SEMICONDUCTOR DEVICE AND METHOD FOR MANUFACTURING SAME

(71) Applicant: Kioxia Corporation, Tokyo (JP)

(72) Inventor: Shinya Arai, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/200,987

(22) Filed: Mar. 15, 2021

(65) Prior Publication Data

US 2021/0202523 A1 Jul. 1, 2021

Related U.S. Application Data

(63) Continuation of application No. 16/844,026, filed on Apr. 9, 2020, now Pat. No. 10,985,181, which is a (Continued)

(30) Foreign Application Priority Data

Feb. 28, 2017 (JP) .............................. JP2017-036973

(51) Int. Cl.
*H01L 27/11582* (2017.01)
*H01L 27/11573* (2017.01)
(Continued)

(52) U.S. Cl.
CPC ........ *H01L 27/11582* (2013.01); *G11C 16/14* (2013.01); *H01L 21/764* (2013.01); *H01L 27/1157* (2013.01); *H01L 27/11524* (2013.01); *H01L 27/11548* (2013.01); *H01L 27/11556* (2013.01); *H01L 27/11573* (2013.01);
(Continued)

(58) Field of Classification Search
CPC ........ H01L 27/11582; H01L 27/11524; H01L 27/1157; H01L 27/11548; H01L 27/11575; H01L 21/764; H01L 29/0649; H01L 27/11573; H01L 27/11556; G11C 16/14

See application file for complete search history.

(56) References Cited

U.S. PATENT DOCUMENTS 8,344,385 B2 * 1/2013 Kim .................. H01L 27/11582
257/326
9,209,031 B2 * 12/2015 Baenninger ....... H01L 21/02587
(Continued)

FOREIGN PATENT DOCUMENTS

| CN | 105977257 A | 9/2016 |
| JP | 2602147 B2 * | 4/1997 |
| JP | 2015-149413 | 8/2015 |

*Primary Examiner* — Earl N Taylor
(74) *Attorney, Agent, or Firm* — Oblon, McClelland, Maier & Neustadt, L.L.P.

(57) ABSTRACT

According to one embodiment, a source layer includes a semiconductor layer including an impurity. A stacked body includes a plurality of electrode layers stacked with an insulator interposed. A gate layer is provided between the source layer and the stacked body. The gate layer is thicker than a thickness of one layer of the electrode layers. A semiconductor body extends in a stacking direction of the stacked body through the stacked body and the gate layer. The semiconductor body further extends in the semiconductor layer where a side wall portion of the semiconductor body contacts the semiconductor layer. The semiconductor body does not contact the electrode layers and the gate layer.

16 Claims, 22 Drawing Sheets

Related U.S. Application Data continuation of application No. 16/438,769, filed on Jun. 12, 2019, now Pat. No. 10,651,199, which is a continuation of application No. 16/040,292, filed on Jul. 19, 2018, now Pat. No. 10,361,218, which is a continuation-in-part of application No. 15/695,252, filed on Sep. 5, 2017, now abandoned.

(51) Int. Cl.

| | |
|---|---|
| *H01L 27/11556* | (2017.01) |
| *H01L 27/11524* | (2017.01) |
| *H01L 27/1157* | (2017.01) |
| *H01L 27/11548* | (2017.01) |
| *H01L 27/11575* | (2017.01) |
| *H01L 21/764* | (2006.01) |
| *H01L 29/06* | (2006.01) |
| *G11C 16/14* | (2006.01) |
| *G11C 16/04* | (2006.01) |
| *H01L 27/11529* | (2017.01) |
| *H01L 21/311* | (2006.01) |
| *H01L 21/3213* | (2006.01) |
| *H01L 21/225* | (2006.01) |
| *H01L 29/167* | (2006.01) |
| *H01L 21/02* | (2006.01) |

(52) U.S. Cl.
CPC .... *H01L 27/11575* (2013.01); *H01L 29/0649* (2013.01); *G11C 16/0408* (2013.01); *G11C 16/0466* (2013.01); *G11C 16/0483* (2013.01); *H01L 21/0217* (2013.01); *H01L 21/2257* (2013.01); *H01L 21/31116* (2013.01); *H01L 21/32133* (2013.01); *H01L 27/11529* (2013.01); *H01L 29/167* (2013.01)

(56) References Cited

U.S. PATENT DOCUMENTS

| | | | | |
|---|---|---|---|---|
| 9,431,419 | B2* | 8/2016 | Fukuzumi | H01L 27/11556 |
| 9,455,263 | B2* | 9/2016 | Zhang | H01L 27/11529 |
| 9,524,979 | B2* | 12/2016 | Arai | H01L 27/11582 |
| 9,627,405 | B1* | 4/2017 | Lee | H01L 27/11582 |
| 9,748,268 | B1* | 8/2017 | Arai | H01L 27/11582 |
| 10,361,218 | B2* | 7/2019 | Arai | H01L 27/11573 |
| 10,651,199 | B2* | 5/2020 | Arai | H01L 27/11524 |
| 2011/0121403 | A1* | 5/2011 | Lee | H01L 27/11551 |
| | | | | 257/E27.06 |
| 2011/0205781 | A1* | 8/2011 | Nakai | H01L 27/2481 |
| | | | | 257/E45.001 |
| 2011/0215408 | A1* | 9/2011 | Tang | H01L 27/10802 |
| | | | | 257/E29.273 |
| 2012/0003828 | A1 | 1/2012 | Chang et al. | |
| 2012/0299086 | A1* | 11/2012 | Lee | H01L 27/11582 |
| | | | | 257/324 |
| 2015/0221667 | A1* | 8/2015 | Fukuzumi | H01L 27/11575 |
| | | | | 257/314 |
| 2015/0380428 | A1* | 12/2015 | Matsuda | H01L 27/11582 |
| | | | | 257/314 |
| 2016/0240552 | A1* | 8/2016 | Arai | H01L 27/1157 |
| 2016/0268263 | A1 | 9/2016 | Lee et al. | |
| 2016/0268285 | A1* | 9/2016 | Okamoto | H01L 27/11582 |
| 2017/0077131 | A1* | 3/2017 | Konagai | H01L 27/11565 |
| 2018/0122904 | A1* | 5/2018 | Matsumoto | H01L 29/1037 |
| 2018/0323213 | A1* | 11/2018 | Arai | H01L 27/11582 |
| 2019/0296046 | A1* | 9/2019 | Arai | H01L 29/0649 |
| 2020/0235125 | A1* | 7/2020 | Arai | H01L 27/11556 |

* cited by examiner

SEMICONDUCTOR DEVICE AND METHOD FOR MANUFACTURING SAME

CROSS-REFERENCE TO RELATED APPLICATIONS

This application is a continuation of and claims the benefit of priority under 35 U.S.C. § 120 from U.S. application Ser. No. 16/844,026 filed Apr. 9, 2020, which is a continuation of U.S. application Ser. No. 16/438,769 filed Jun. 12, 2019 (now U.S. Pat. No. 10,651,199 issued May 12, 2020), which is a continuation of U.S. application Ser. No. 16/040,292 filed Jul. 19, 2018 (now U.S. Pat. No. 10,361,218 issued Jul. 23, 2019), which is a continuation-in-part of U.S. patent application Ser. No. 15/695,252 filed Sep. 5, 2017, which claims the benefit of priority under 35 U.S.C. § 119 from Japanese Patent Application No. 2017-036973 filed Feb. 28, 2017, the entire contents of each of which are incorporated herein by reference.

FIELD

Embodiments described herein relate generally to a semiconductor device and a method for manufacturing a semiconductor device.

BACKGROUND

Three-dimensional memory has been proposed to have a structure in which a side wall of a channel body piercing a stacked body including multiple electrode layers contacts a source layer provided under the stacked body.

DETAILED DESCRIPTION

According to one embodiment, a semiconductor device includes a source layer, a stacked body, a gate layer, a semiconductor body, and a charge storage portion. The source layer includes a semiconductor layer including an impurity. The stacked body is provided above the source layer. The stacked body includes a plurality of electrode layers stacked with an insulator interposed. The gate layer is provided between the source layer and the stacked body. The gate layer is thicker than a thickness of one layer of the electrode layers. The semiconductor body extends in a stacking direction of the stacked body through the stacked body and the gate layer. The semiconductor body further extends in the semiconductor layer where a side wall portion of the semiconductor body contacts the semiconductor layer. The semiconductor body does not contact the electrode layers and the gate layer. The charge storage portion is provided between the semiconductor body and one of the electrode layers.

In an embodiment, for example, a semiconductor memory device that includes a memory cell array having a three-dimensional structure is described as a semiconductor device.

Figure 1:
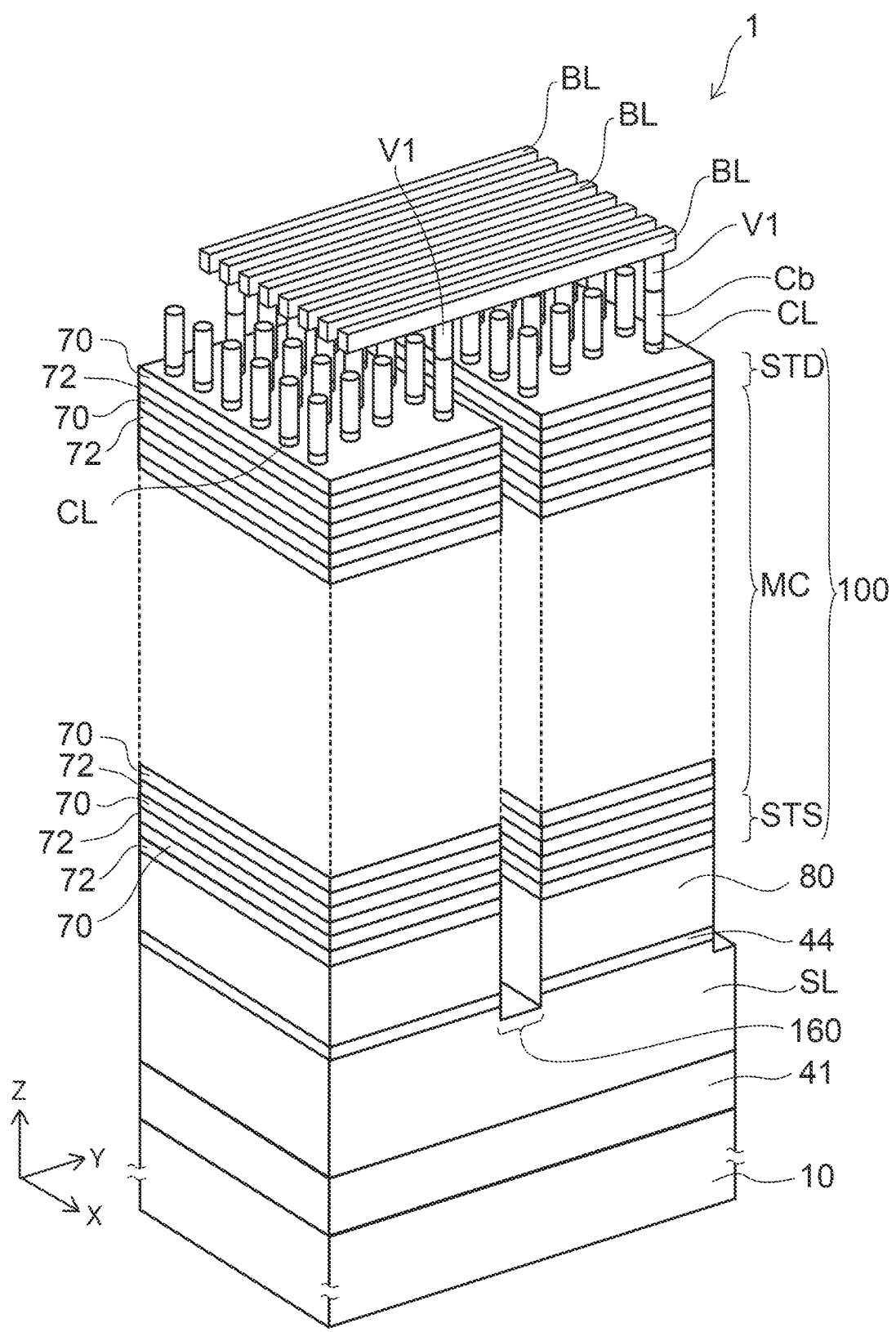
FIG. 1 is a schematic perspective view of a semiconductor device of an embodiment.

FIG. 1 is a schematic perspective view of a memory cell array 1 of an embodiment.

Figure 2:
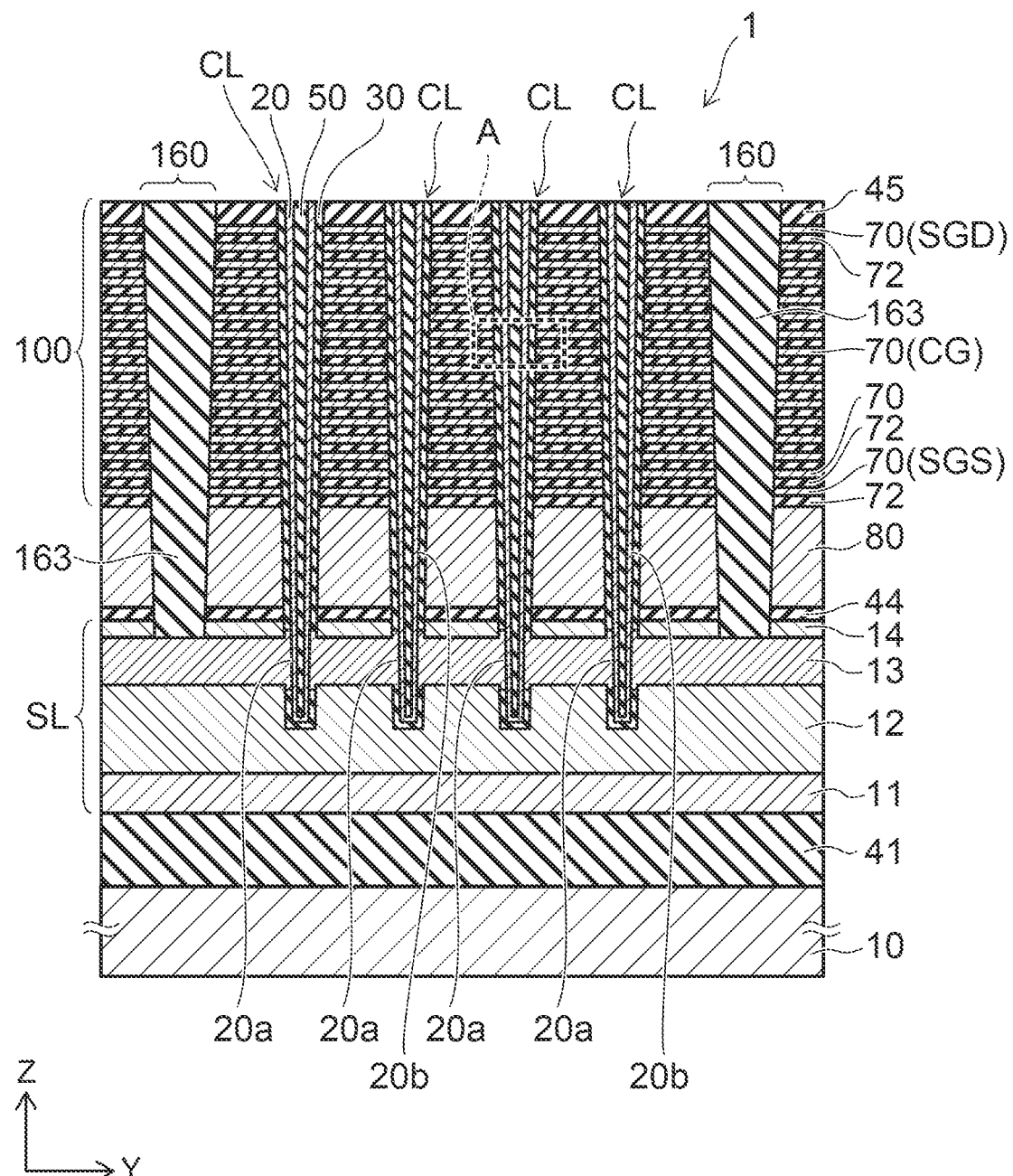
FIG. 2 is a schematic cross-sectional view of the semiconductor device of the embodiment.

FIG. 2 is a schematic cross-sectional view of the memory cell array 1.

In FIG. 1, two mutually-orthogonal directions parallel to a major surface of a substrate 10 are taken as an X-direction and a Y-direction; and a direction orthogonal to both the X-direction and the Y-direction is taken as a Z-direction (the stacking direction). The Y-direction and the Z-direction of FIG. 2 correspond respectively to the Y-direction and the Z-direction of FIG. 1.

The memory cell array 1 includes a source layer SL, a stacked body 100 provided on the source layer SL, a gate layer 80 provided between the source layer SL and the stacked body 100, multiple columnar portions CL, multiple separation portions 160, and multiple bit lines BL provided above the stacked body 100. The source layer SL is provided on the substrate 10 with an insulating layer 41 interposed. The substrate 10 is, for example, a silicon substrate.

The columnar portions CL are formed in substantially circular columnar configurations extending through the stacked body 100 in the stacking direction (the Z-direction). The columnar portions CL further pierce the gate layer 80 under the stacked body 100 and reach the source layer SL. The multiple columnar portions CL have, for example, a staggered arrangement. Or, the multiple columnar portions CL may have a square lattice arrangement along the X-direction and the Y-direction.

The separation portions 160 separate the stacked body 100 and the gate layer 80 into multiple blocks (or finger portions) in the Y-direction. The separation portions 160 have a structure in which an insulating film 163 is filled into slits ST shown in FIG. 17 described below.

The multiple bit lines BL extend in the Y-direction and are, for example, metal films. The multiple bit lines BL are separated from each other in the X-direction.

Upper end portions of semiconductor bodies 20 of the columnar portions CL described below are connected to the bit lines BL via contacts Cb and contacts V1 shown in FIG. 1.

As shown in FIG. 2, the source layer SL includes semiconductor layers 12 to 14, and a layer 11 including a metal.

The layer 11 that includes the metal is provided on the insulating layer 41. The layer 11 that includes the metal is, for example, a tungsten layer or a tungsten silicide layer.

The semiconductor layer 12 is provided on the layer 11 including the metal; the semiconductor layer 13 is provided on the semiconductor layer 12; and the semiconductor layer 14 is provided on the semiconductor layer 13.

The semiconductor layers 12 to 14 are polycrystalline silicon layers that are conductive and include an impurity. The semiconductor layers 12 to 14 are, for example, n-type polycrystalline silicon layers doped with phosphorus. The semiconductor layer 14 may be an undoped polycrystalline silicon layer in which an impurity is not doped intentionally.

The thickness of the semiconductor layer 14 is thinner than the thickness of the semiconductor layer 12 and the thickness of the semiconductor layer 13.

An insulating layer 44 is provided on the semiconductor layer 14; and the gate layer 80 is provided on the insulating layer 44. The gate layer 80 is a polycrystalline silicon layer that is conductive and includes an impurity. The gate layer 80 is, for example, an n-type polycrystalline silicon layer doped with phosphorus. The thickness of the gate layer 80 is thicker than the thickness of the semiconductor layer 14.

The stacked body 100 is provided on the gate layer 80. The stacked body 100 includes multiple electrode layers 70 stacked in a direction (the Z-direction) perpendicular to the major surface of the substrate 10. Insulating layers (insulators) 72 are provided between the electrode layers 70 adjacent to each other above and below. The insulating layer 72 is provided between the gate layer 80 and the electrode layer 70 of the lowermost layer. An insulating layer 45 is provided on the electrode layer 70 of the uppermost layer.

The electrode layer 70 is a metal layer. The electrode layer 70 is, for example, a tungsten layer including tungsten as a major component or a molybdenum layer including molybdenum as a major component. The insulating layer 72 is a silicon oxide layer including silicon oxide as a major component.

The electrode layer 70 of at least the uppermost layer of the multiple electrode layers 70 is a drain-side selection gate SGD of a drain-side selection transistor STD (FIG. 1); and the electrode layer 70 of at least the lowermost layer of the multiple electrode layers 70 is a source-side selection gate SGS of a source-side selection transistor STS (FIG. 1). For example, the electrode layers 70 of multiple layers (e.g., three layers) on the lower layer side including the electrode layer 70 of the lowermost layer are the source-side selection gate SGS. Multiple layers may be provided also in the drain-side selection gate SGD.

Multiple layers of electrode layers 70 are provided as cell gates CG between the drain-side selection gate SGD and the source-side selection gate SGS.

The gate layer 80 is thicker than the thickness of one layer of the electrode layers 70 and the thickness of one layer of the insulating layers 72. Accordingly, the gate layer 80 is thicker than the thickness of one layer of the drain-side selection gate SGD, the thickness of one layer of the source-side selection gate SGS, and the thickness of one layer of the cell gates CG.

The multiple columnar portions CL extend through the stacked body 100 in the stacking direction and further pierce the gate layer 80, the insulating layer 44, the semiconductor layer 14, and the semiconductor layer 13 to reach the semiconductor layer 12.

Figure 3:
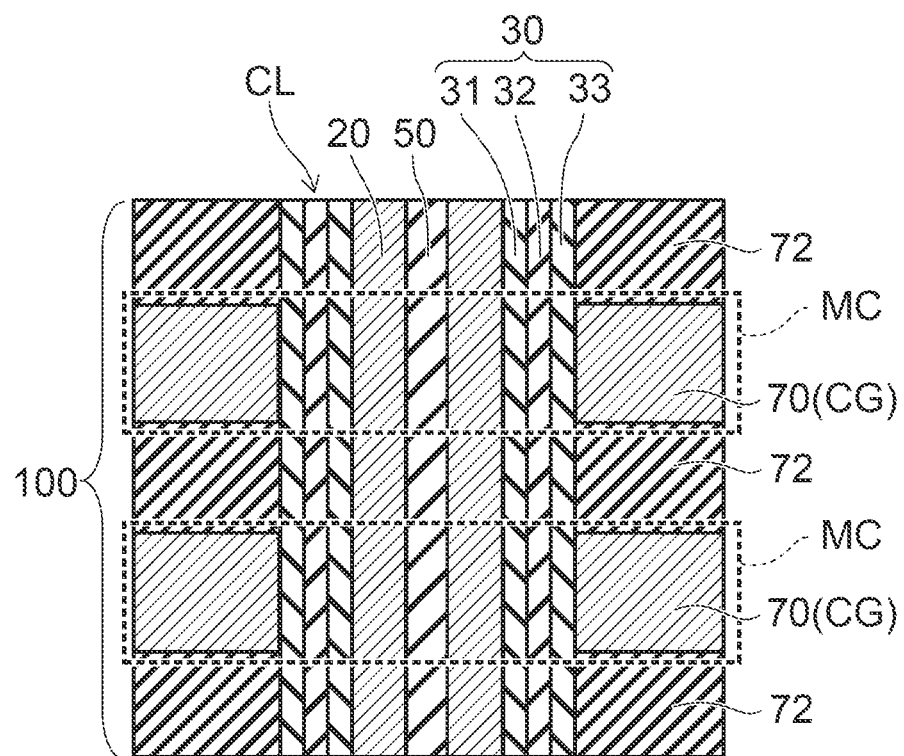
FIG. 3 is an enlarged cross-sectional view of portion A of FIG. 2.

FIG. 3 is an enlarged cross-sectional view of portion A of FIG. 2.

The columnar portion CL includes a memory film 30, the semiconductor body 20, and an insulative core film 50. The memory film 30 is a stacked film of insulating films including a tunneling insulating film 31, a charge storage film (a charge storage portion) 32, and a blocking insulating film 33.

As shown in FIG. 2, the semiconductor body 20 is formed in a pipe-like configuration extending to be continuous in the Z-direction through the stacked body 100 and the gate layer 80, and reaches the source layer SL. The core film 50 is provided on the inner side of the semiconductor body 20 having the pipe-like configuration.

The upper end portion of the semiconductor body 20 is connected to the bit line BL via the contact Cb and the contact V1 shown in FIG. 1. A side wall portion 20a that is on the lower end side of the semiconductor body 20 contacts the semiconductor layer 13 of the source layer SL.

The memory film 30 is provided between the stacked body 100 and the semiconductor body 20 and between the gate layer and the semiconductor body 20, and surrounds the semiconductor body 20 from the outer perimeter side.

The memory film 30 extends to be continuous in the Z-direction through the stacked body 100 and the gate layer 80. The memory film 30 is not provided at the side wall portion (the source contact portion) 20a of the semiconductor body 20 contacting the semiconductor layer 13. The side wall portion 20a is not covered with the memory film 30. The memory film 30 may be disposed at a portion of the outer perimeter of the semiconductor body 20 between the semiconductor body 20 and the semiconductor layer 13.

The lower end portion of the semiconductor body 20 is continuous with the side wall portion 20a, is positioned lower than the side wall portion 20a, and is positioned inside the semiconductor layer 12. The memory film 30 is provided between the semiconductor layer 12 and the lower end portion of the semiconductor body 20. Accordingly, the memory film 30 is divided in the Z-direction at the position of the side wall portion 20a of the semiconductor body 20. The lower portion of the divided memory film 30 is disposed at a position surrounding the outer perimeter of the lower end portion of the semiconductor body 20, and under the bottom surface of the semiconductor body 20.

As shown in FIG. 3, the tunneling insulating film 31 is provided between the semiconductor body 20 and the charge storage film 32 and contacts the semiconductor body 20. The charge storage film 32 is provided between the tunneling insulating film 31 and the blocking insulating film 33. The blocking insulating film 33 is provided between the charge storage film 32 and the electrode layer 70.

The semiconductor body 20, the memory film 30, and the electrode layer 70 (the cell gate CG) are included in a memory cell MC. The memory cell MC has a vertical transistor structure in which the electrode layer 70 (the cell gate CG) surrounds the periphery of the semiconductor body 20 with the memory film 30 interposed.

In the memory cell MC having the vertical transistor structure, the semiconductor body 20 is, for example, a channel body of silicon; and the electrode layer 70 (the cell gate CG) functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film, and includes, for example, a silicon nitride film. Or, the charge storage film 32 may be a conductive floating gate surrounded with an insulating body.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the columnar portion CL.

The blocking insulating film 33 includes, for example, a silicon oxide film. Or, the blocking insulating film 33 may have a stacked structure of a silicon oxide film and a metal oxide film. In such a case, the silicon oxide film may be provided between the charge storage film 32 and the metal oxide film; and the metal oxide film may be provided between the silicon oxide film and the electrode layer 70. The metal oxide film is, for example, an aluminum oxide film.

As shown in FIG. 1, the drain-side selection transistor STD is provided in the upper layer portion of the stacked body 100. The source-side selection transistor STS is provided in the lower layer portion of the stacked body 100.

The drain-side selection transistor STD is a vertical transistor having the drain-side selection gate SGD described above (FIG. 2) as a control gate; and the source-side selection transistor STS is a vertical transistor having the source-side selection gate SGS described above (FIG. 2) as a control gate.

The portion of the semiconductor body 20 opposing the drain-side selection gate SGD functions as a channel; and the memory film 30 that is between the channel and the drain-side selection gate SGD functions as a gate insulating film of the drain-side selection transistor STD.

The portion of the semiconductor body 20 opposing the source-side selection gate SGS functions as a channel; and the memory film 30 that is between the channel and the source-side selection gate SGS functions as a gate insulating film of the source-side selection transistor STS.

Multiple drain-side selection transistors STD that are connected in series via the semiconductor body 20 may be provided; and multiple source-side selection transistors STS that are connected in series via the semiconductor body 20 may be provided. The same gate potential is applied to the multiple drain-side selection gates SGD of the multiple drain-side selection transistors STD; and the same gate potential is applied to the multiple source-side selection gates SGS of the multiple source-side selection transistors STS.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20 of the columnar portion CL, and are included in one memory string. For example, the memory strings have a staggered arrangement in a planar direction parallel to the XY plane; and the multiple memory cells MC are provided three-dimensionally in the X-direction, the Y-direction, and the Z-direction.

The side wall portion 20a of the semiconductor body 20 contacts the semiconductor layer 13 doped with the impurity (e.g., phosphorus); and the side wall portion 20a also includes the impurity (e.g., phosphorus). The impurity concentration of the side wall portion 20a is higher than the impurity concentration of the portion of the semiconductor body 20 opposing the stacked body 100. The impurity concentration of the side wall portion 20a is higher than the impurity concentration of the channel of the memory cell MC, the impurity concentration of the channel of the source-side selection transistor STS, and the impurity concentration of the channel of the drain-side selection transistor STD.

By heat treatment described below, the impurity (e.g., phosphorus) is diffused from the side wall portion 20a into a portion 20b of the semiconductor body 20 opposing the gate layer 80. The impurity (e.g., phosphorus) is included also in a portion between the side wall portion 20a and the portion 20b of the semiconductor body 20 (a portion corresponding to the insulating layer 44).

The impurity is not diffused into the entire region of the portion 20b of the semiconductor body 20; and the impurity concentration of the region of the portion 20b on the stacked body 100 side is lower than the impurity concentration of the region of the portion 20b on the side wall portion 20a side. The impurity concentration in the portion 20b has a gradient decreasing from the side wall portion 20a side toward the stacked body 100 side. The impurity concentration of the region of the portion 20b on the side wall portion 20a side is higher than the impurity concentration of the portion of the semiconductor body 20 opposing the stacked body 100.

In a read operation, electrons are supplied to the channel of the memory cell MC from the source layer SL via the side wall portion 20a of the semiconductor body 20. At this time, a channel (an n-type channel) can be induced in the entire region of the portion 20b of the semiconductor body 20 by applying an appropriate potential to the gate layer 80. The memory film 30 that is between the gate layer 80 and the portion 20b of the semiconductor body 20 functions as a gate insulating film.

Although there may be cases where it is difficult to cut off the conduction of the portion 20b using the potential control of the gate layer 80 because the portion 20b of the semiconductor body 20 includes the impurity as described above, the source-side selection transistor STS performs the function of the cut-off. The impurity recited above is not diffused to the channel of the source-side selection transistor STS.

The distance between the portion 20b and the side wall portion 20a of the semiconductor body 20 is less than the thickness of the gate layer 80. The distance between the portion 20b and the side wall portion 20a of the semiconductor body 20 substantially corresponds to the total thickness of the thickness of the semiconductor layer 14 and the thickness of the insulating layer 44.

As described below, the thick gate layer 80 is used as an etching stopper when forming the slits ST. Therefore, the semiconductor layer 14 can be thin. The thickness of the gate layer 80 is, for example, about 200 nm; and the thickness of the semiconductor layer 14 is, for example, about 30 nm. Accordingly, the distance of diffusing the impurity from the side wall portion 20a to the portion of the semiconductor body 20 opposing the insulating layer 44 can be short; and the diffusion of the impurity to the region where channel induction by the gate layer 80 is difficult can be controlled easily.

Also, the gate layer 80 can function as a GIDL (gate induced drain leakage) generator in an erase operation because the portion 20b of the semiconductor body 20 opposing the gate layer 80 includes the impurity.

Holes generated by applying a high electric field to the portion 20b of the semiconductor body 20 by applying an erasing potential (e.g., several volts) to the gate layer 80 are supplied to the channel of the memory cell MC; and the channel potential is increased. Then, by setting the potentials of the cell gates CG to, for example, the ground potential (0 V), the holes are injected into the charge storage film 32 by the potential difference between the semiconductor body 20 and the cell gates CG; and the erase operation of the data is performed.

A method for manufacturing the semiconductor device of the embodiment will now be described with reference to FIG. 4 to FIG. 17. The cross sections of FIG. 4 to FIG. 17 correspond to the cross section of FIG. 2.

Figure 4:
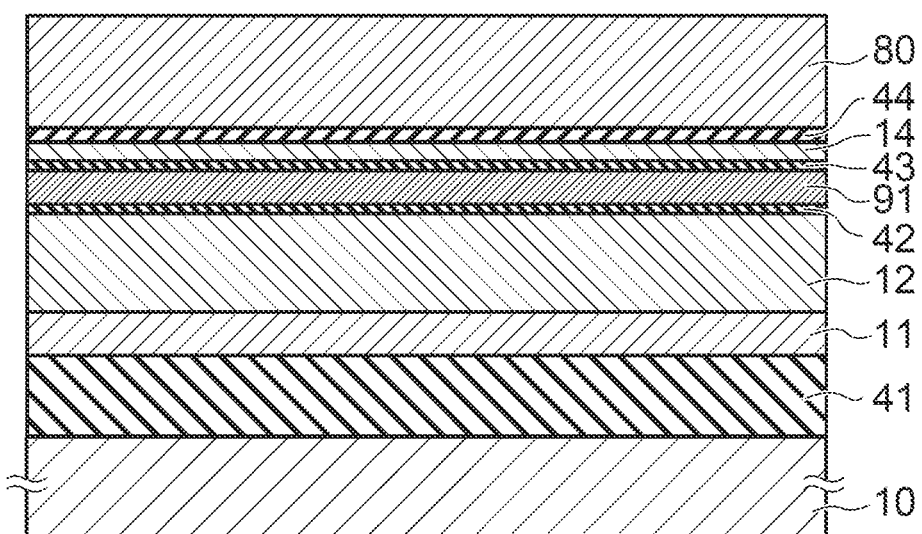
FIG. 4 to FIG. 17 are schematic cross-sectional views showing a method for manufacturing the semiconductor device of the embodiment.

As shown in FIG. 4, the insulating layer 41 is formed on the substrate 10. The layer 11 that includes the metal is formed on the insulating layer 41. The layer 11 that includes the metal is, for example, a tungsten layer or a tungsten silicide layer.

The semiconductor layer (the first semiconductor layer) is formed on the layer 11 including the metal. The semiconductor layer 12 is, for example, a polycrystalline silicon layer doped with phosphorus. The thickness of the semiconductor layer 12 is, for example, about 200 nm.

A protective film 42 is formed on the semiconductor layer 12. The protective film 42 is, for example, a silicon oxide film.

A sacrificial layer 91 is formed on the protective film 42. The sacrificial layer 91 is, for example, an undoped polycrystalline silicon layer. The thickness of the sacrificial layer 91 is, for example, about 30 nm.

A protective film 43 is formed on the sacrificial layer 91. The protective film 43 is, for example, a silicon oxide film.

The semiconductor layer (the second semiconductor layer) 14 is formed on the protective film 43. The semiconductor layer 14 is, for example, a polycrystalline silicon layer that is undoped or is doped with phosphorus. The thickness of the semiconductor layer 14 is, for example, about 30 nm.

The insulating layer 44 is formed on the semiconductor layer 14. The insulating layer 44 is, for example, a silicon oxide layer.

The gate layer 80 is formed on the insulating layer 44. The gate layer 80 is, for example, a polycrystalline silicon layer doped with phosphorus. The thickness of the gate layer 80 is thicker than the thickness of the semiconductor layer 14 and the thickness of the insulating layer 44 and is, for example, about 200 nm.

Figure 5:
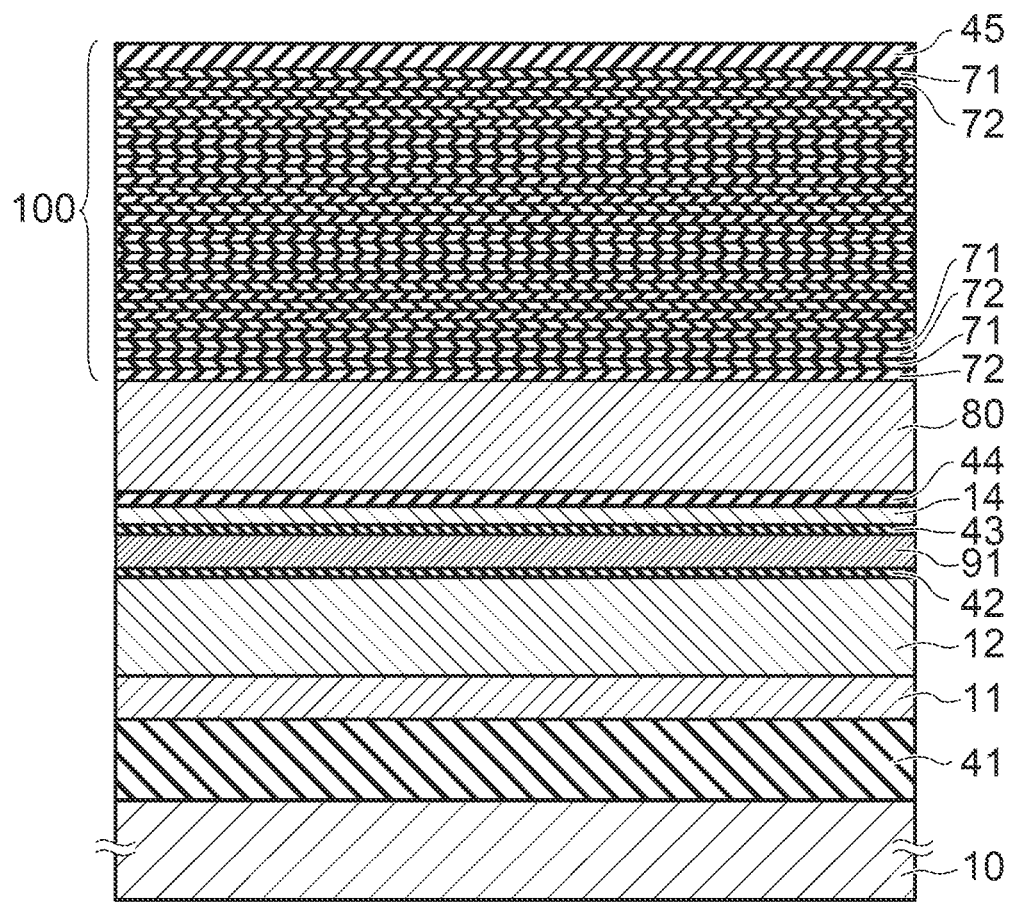

As shown in FIG. 5, the stacked body 100 is formed on the gate layer 80. The insulating layer (a second layer) 72 and the sacrificial layer (a first layer) 71 are stacked alternately on the gate layer 80. The process of alternately stacking the insulating layer 72 and the sacrificial layer 71 is repeated; and the multiple sacrificial layers 71 and the multiple insulating layers 72 are formed on the gate layer 80. The insulating layer 45 is formed on the sacrificial layer 71 of the uppermost layer. For example, the sacrificial layer 71 is a silicon nitride layer; and the insulating layer 72 is a silicon oxide layer. The insulating layer 45 is, for example, a silicon oxide layer.

The thickness of the gate layer 80 is thicker than the thickness of one layer of the sacrificial layers 71 and the thickness of one layer of the insulating layers 72.

Figure 6:
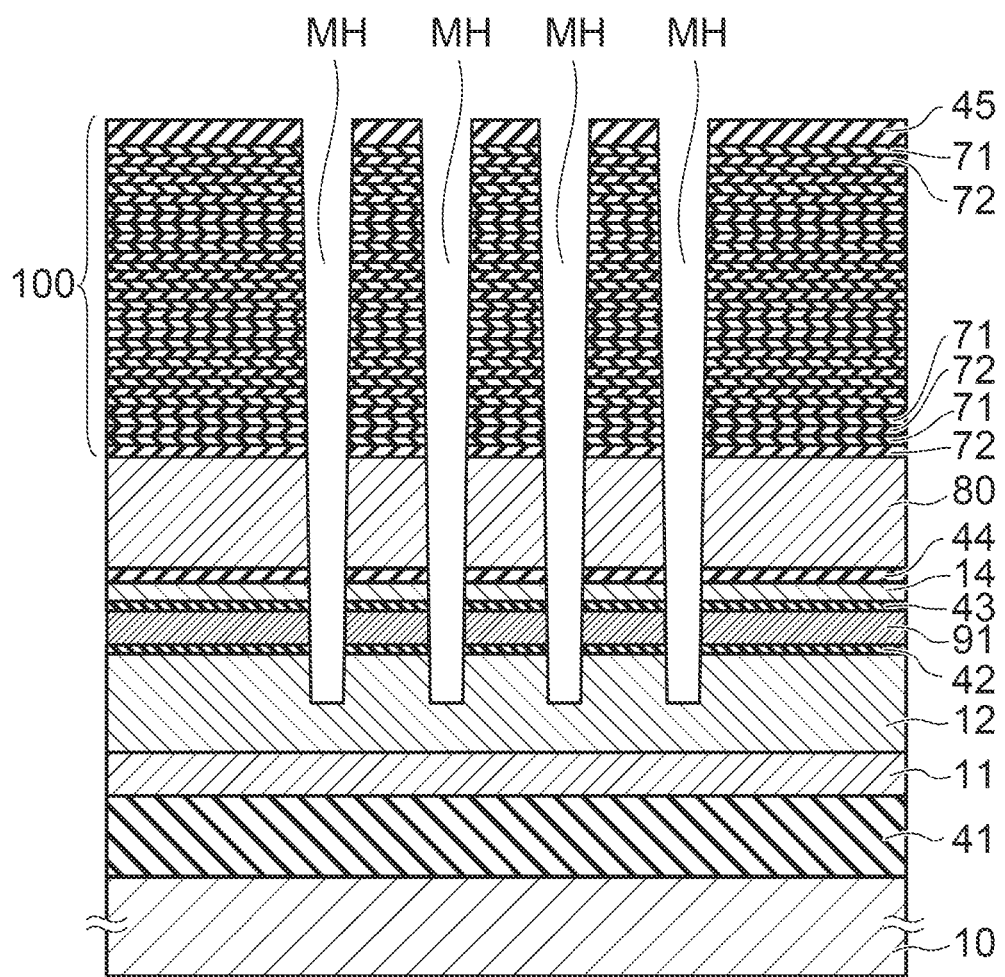

As shown in FIG. 6, multiple memory holes MH are formed in the layers higher than the semiconductor layer 12. The memory holes MH are formed by reactive ion etching (RIE) using a not-illustrated mask layer. The memory holes MH pierce the stacked body 100, the gate layer 80, the insulating layer 44, the semiconductor layer 14, the protective film 43, the sacrificial layer 91, and the protective film 42 and reach the semiconductor layer 12. The bottoms of the memory holes MH are positioned inside the semiconductor layer 12.

The multiple sacrificial layers (the silicon nitride layer) 71 and the multiple insulating layers (the silicon oxide layers) 72 are etched continuously using the same gas (e.g., a CF-based gas) without switching the gas type. At this time, the gate layer (the polycrystalline silicon layer) 80 functions as an etching stopper; and the etching is stopped once at the position of the gate layer 80. The etching rate fluctuation between the multiple memory holes MH is absorbed by the thick gate layer 80; and the fluctuation of the bottom positions between the multiple memory holes MH is reduced.

Subsequently, step etching of each layer is performed by switching the gas type. The remaining portion of the gate layer 80 is etched using the insulating layer 44 as a stopper; the insulating layer 44 is etched using the semiconductor layer 14 as a stopper; the semiconductor layer 14 is etched using the protective film 43 as a stopper; the protective film 43 is etched using the sacrificial layer 91 as a stopper; the sacrificial layer 91 is etched using the protective film 42 as a stopper; and the protective film 42 is etched using the semiconductor layer 12 as a stopper. Then, the etching is stopped partway through the thick semiconductor layer 12.

The control of the etching stop position of the hole patterning for the stacked body 100 having a high aspect ratio is performed easily using the thick gate layer 80.

Figure 7:
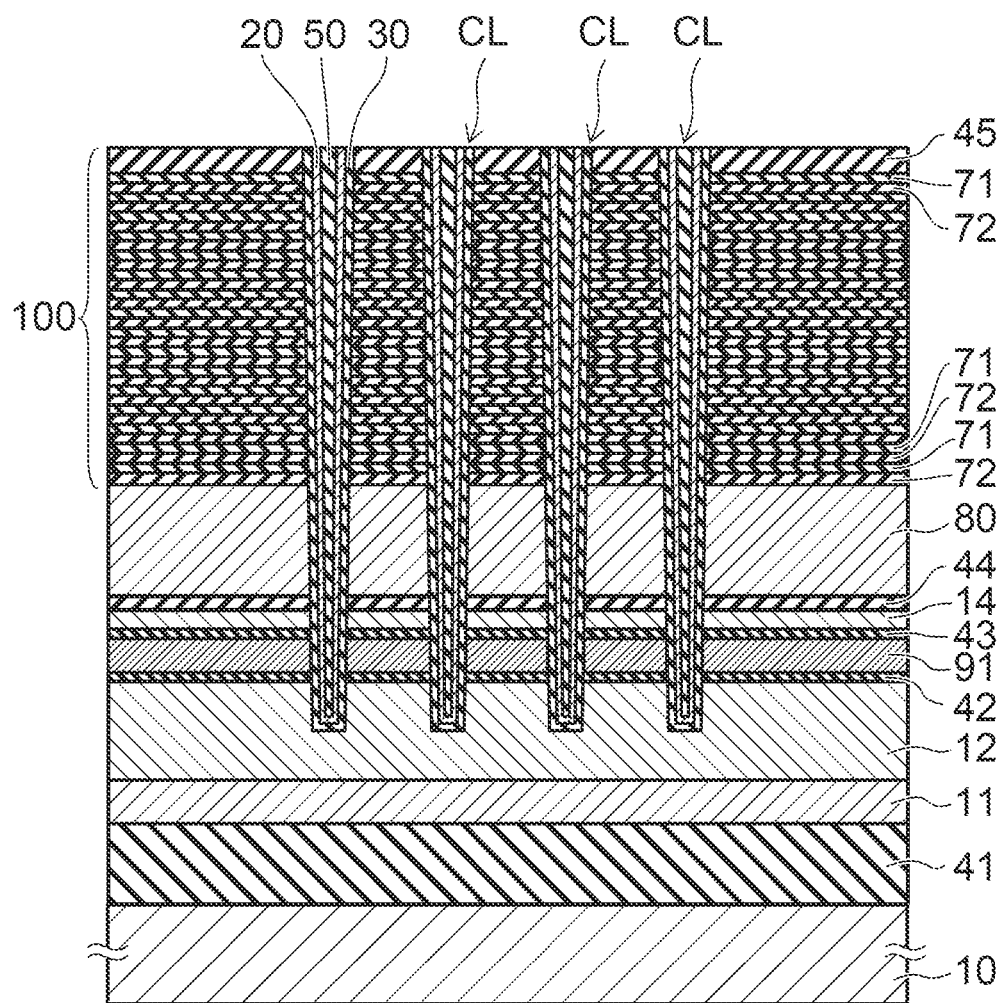

As shown in FIG. 7, the columnar portions CL are formed inside the memory holes MH. The memory film 30 is formed conformally along the side surfaces and bottoms of the memory holes MH; the semiconductor body 20 is formed conformally along the memory film 30 on the inner side of the memory film 30; and the core film 50 is formed on the inner side of the semiconductor body 20.

Figure 8:
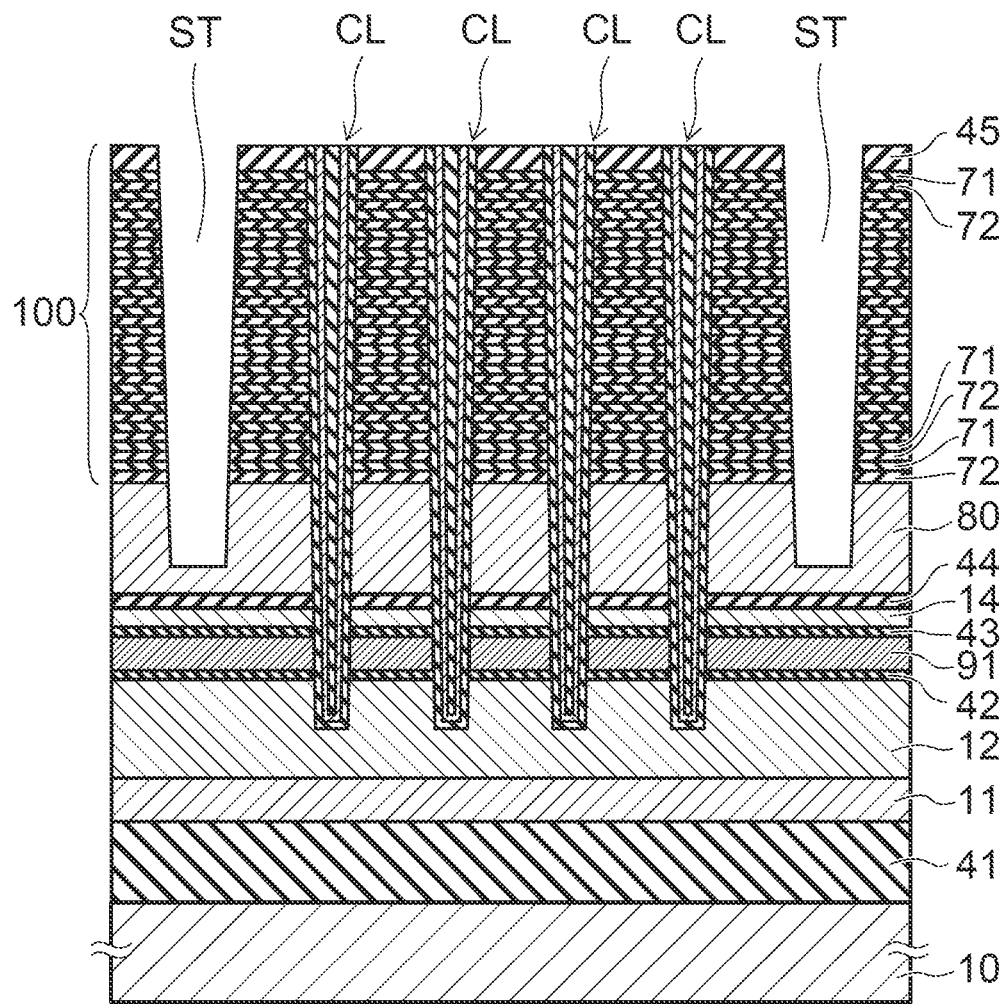

Subsequently, as shown in FIG. 8, the multiple slits ST are formed in the stacked body 100. The slits ST are formed by RIE using a not-illustrated mask layer. The slits ST pierce the stacked body 100 and reach the gate layer 80.

Similarly to the formation of the memory holes MH, the multiple sacrificial layers 71 and the multiple insulating layers 72 are etched continuously using the same gas (e.g., a CF-based gas) without switching the gas type. At this time, the gate layer 80 functions as an etching stopper; and the etching of the slit patterning is stopped once at the position of the gate layer 80. The etching rate fluctuation between the multiple slits ST is absorbed by the thick gate layer 80; and the fluctuation of the bottom positions between the multiple slits ST is reduced.

Figure 9:
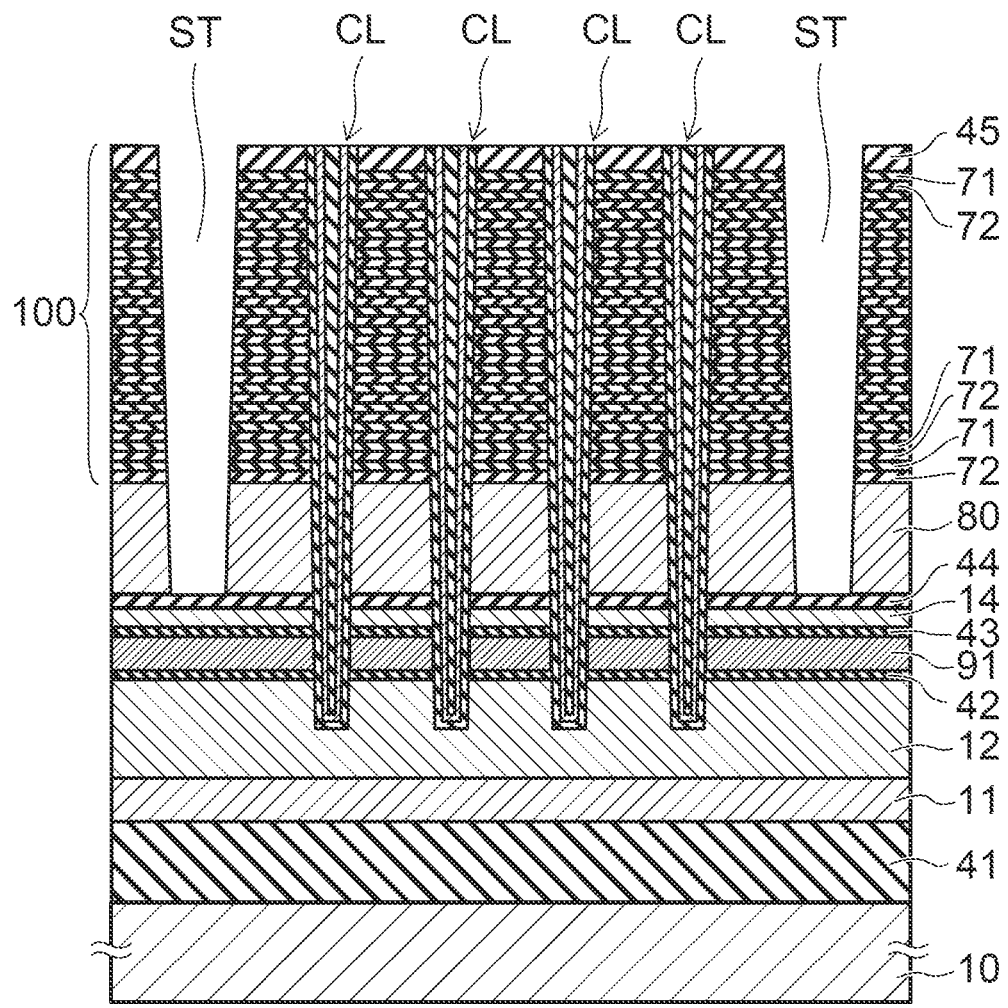

Subsequently, step etching of each layer is performed by switching the gas type. The remaining portion of the gate layer 80 is etched using the insulating layer 44 as a stopper. As shown in FIG. 9, the insulating layer 44 is exposed at the bottoms of the slits ST.

Figure 10:
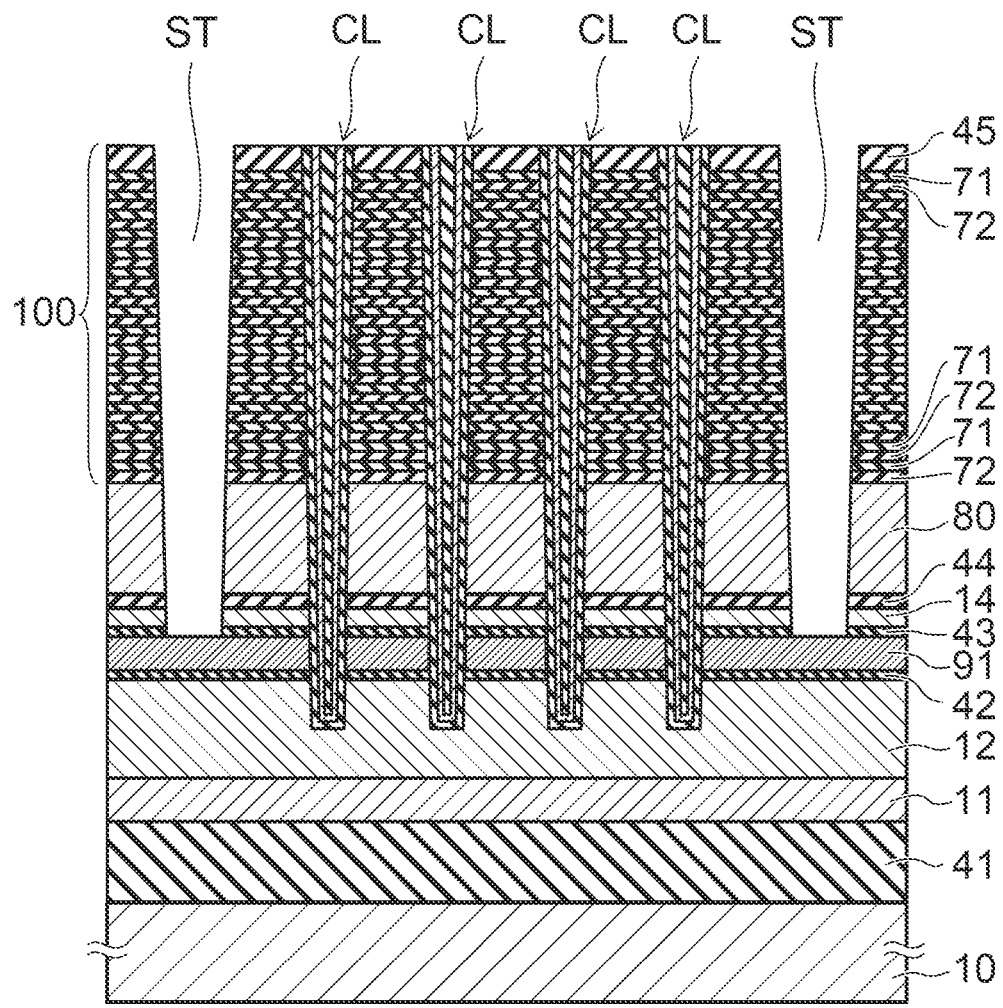

Then, the insulating layer 44 is etched using the semiconductor layer 14 as a stopper; and the semiconductor layer 14 is etched using the protective film 43 as a stopper. As shown in FIG. 10, the sacrificial layer 91 is exposed at the bottoms of the slits ST.

The control of the etching stop position of the slit patterning for the stacked body 100 having a high aspect ratio is performed easily using the thick gate layer 80. The bottom position control of the slits ST is performed with high precision and easily by the subsequent step etching. The bottoms of the slits ST stop inside the sacrificial layer 91 without the slits ST extending through the sacrificial layer 91.

Figure 11:
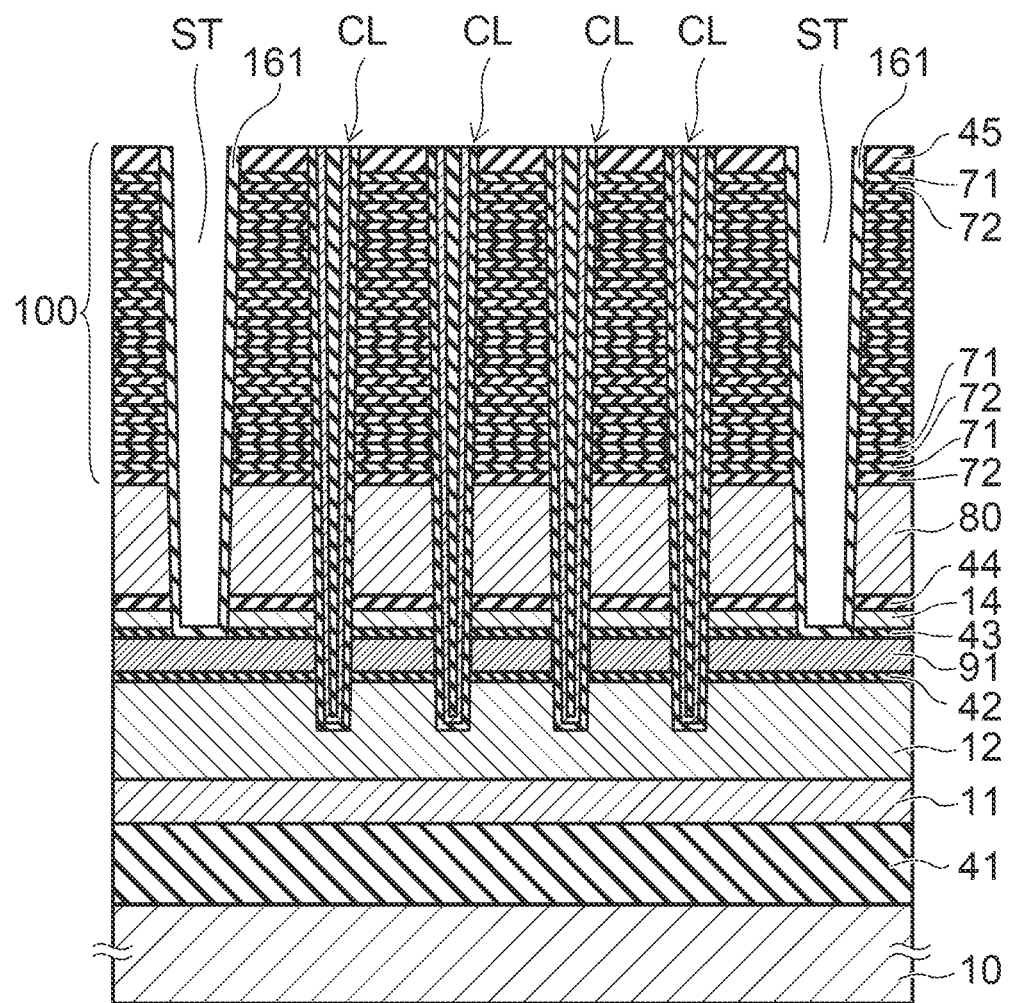

At the side surfaces and bottoms of the slits ST as shown in FIG. 11, a liner film 161 is formed conformally along the side surfaces and bottoms of the slits ST. The liner film 161 is, for example, a silicon nitride film.

Figure 12:
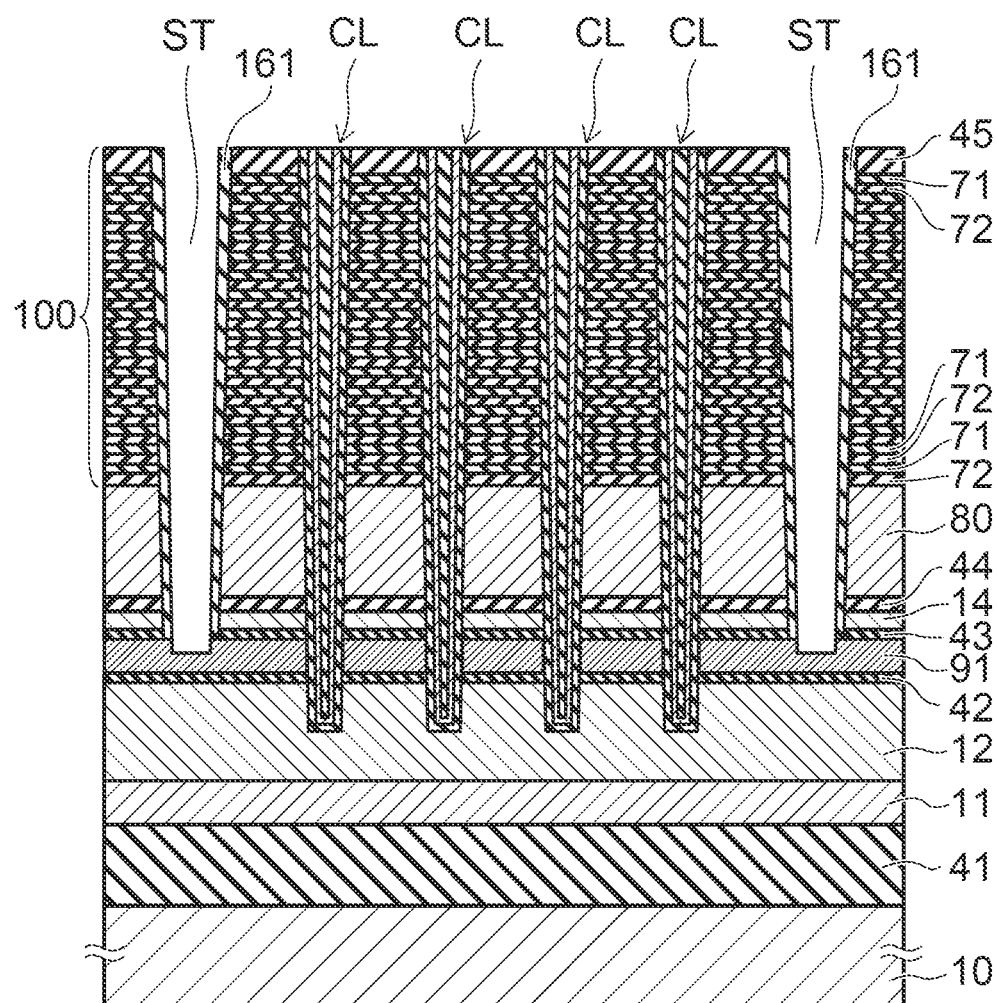

The liner film 161 formed on the bottoms of the slits ST is removed by, for example, RIE. As shown in FIG. 12, the sacrificial layer 91 is exposed at the bottoms of the slits ST.

Then, the sacrificial layer 91 is removed by etching through the slits ST. For example, the sacrificial layer 91 which is a polycrystalline silicon layer is removed by supplying hot TMY (trimethyl-2 hydroxyethyl ammonium hydroxide) through the slits ST.

Figure 13:
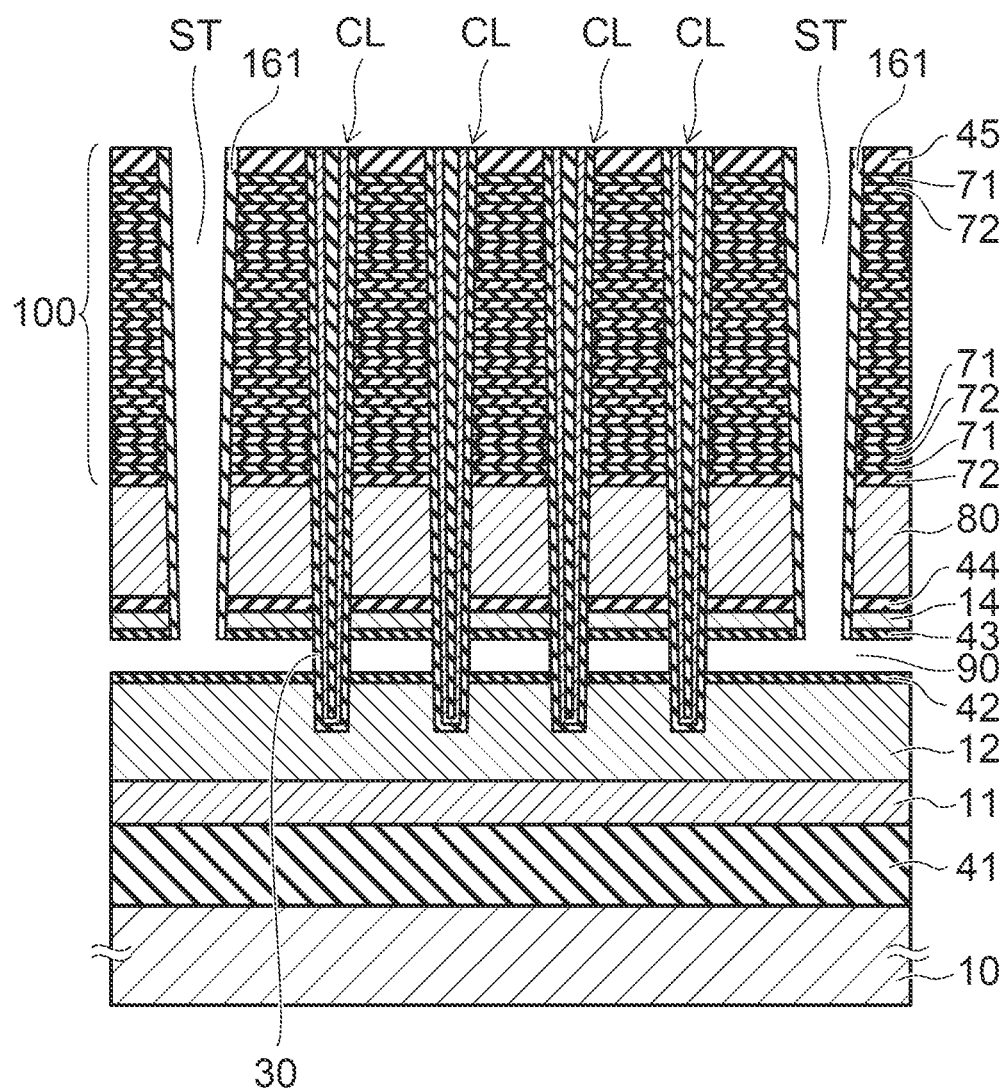

The sacrificial layer 91 is removed; and an air gap 90 is formed between the semiconductor layer 12 and the semiconductor layer 14 as shown in FIG. 13. For example, the protective films 42 and 43 which are silicon oxide films protect the semiconductor layers 12 and 14 from the etching using hot TMY. Also, the liner film (e.g., the silicon nitride film) 161 formed on the side surfaces of the slits ST prevents side etching of the gate layer 80 and the semiconductor layer 14 from the slit ST side.

A portion of the side wall of the columnar portion CL is exposed in the air gap 90. A portion of the memory film 30 is exposed.

The portion of the memory film 30 exposed in the air gap 90 is removed by etching through the slits ST. For example, the memory film 30 is etched by CDE (chemical dry etching).

At this time, the protective films 42 and 43 that are the same type of film included in the memory film 30 also are removed. The liner film 161 formed on the side surfaces of the slits ST is a silicon nitride film that is the same type of film as the charge storage film 32 included in the memory film 30; but the film thickness of the liner film 161 is thicker than the film thickness of the charge storage film 32; and the liner film 161 remains on the side surfaces of the slits ST.

The liner film 161 prevents side etching of the sacrificial layers 71, the insulating layers 72, and the insulating layer 44 from the slit ST side when removing the portion of the memory film 30 recited above that is exposed in the air gap 90. Etching from the lower surface side of the insulating layer 44 also is prevented because the lower surface of the insulating layer 44 is covered with the semiconductor layer 14.

Figure 14:
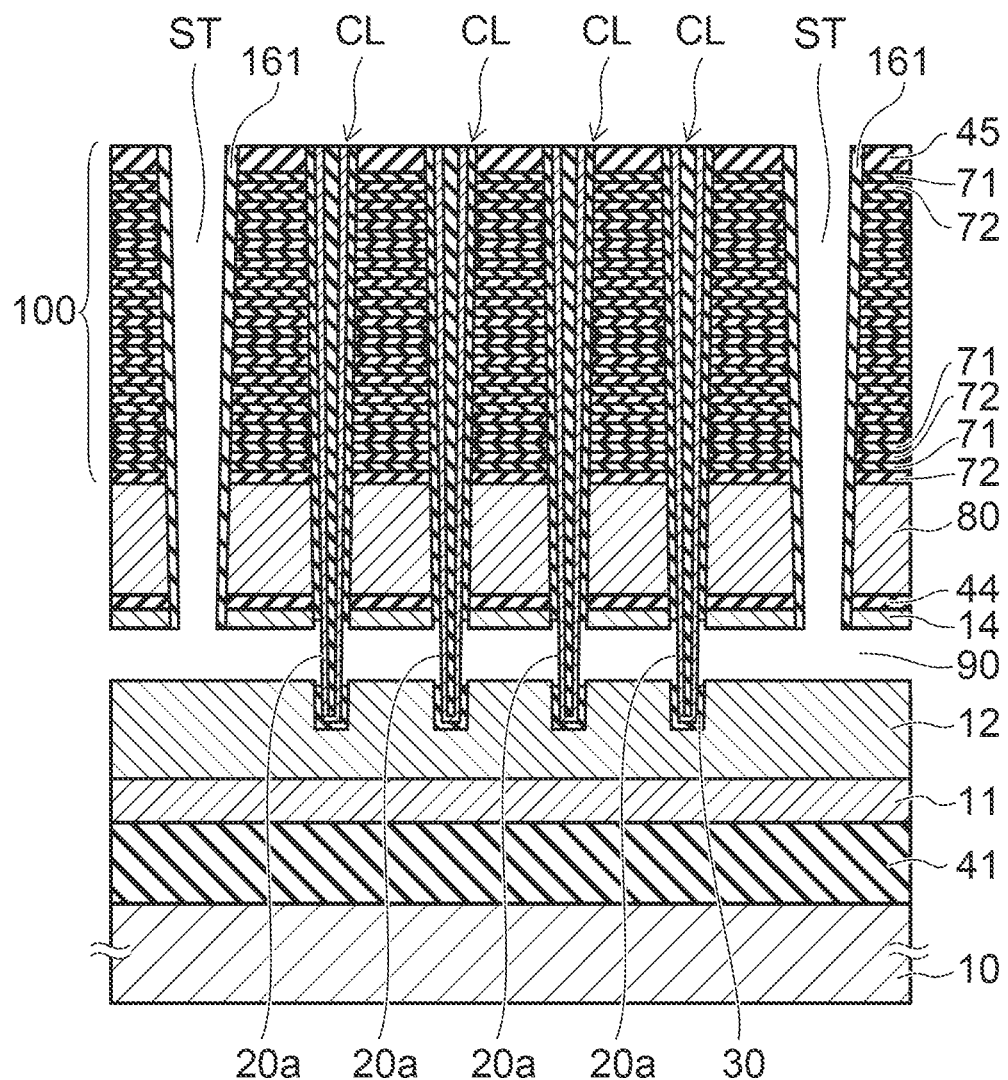

By removing the portion of the memory film 30, the memory film 30 is divided vertically at the portion of the side wall portion 20a as shown in FIG. 14. The etching time is controlled so that the memory film (the gate insulating film) 30 between the gate layer 80 and the semiconductor body 20 is not etched.

Also, the etching time is controlled so that the memory film 30 also remains between the semiconductor layer 12 and the semiconductor body 20 below the side wall portion 20a. The lower end portion of the semiconductor body 20 below the side wall portion 20a is held in a state of being supported by the semiconductor layer 12 with the memory film 30 interposed.

The portion of the memory film 30 recited above is removed; and a portion (the side wall portion 20a) of the semiconductor body 20 is exposed in the air gap 90 as shown in FIG. 14.

Figure 15:
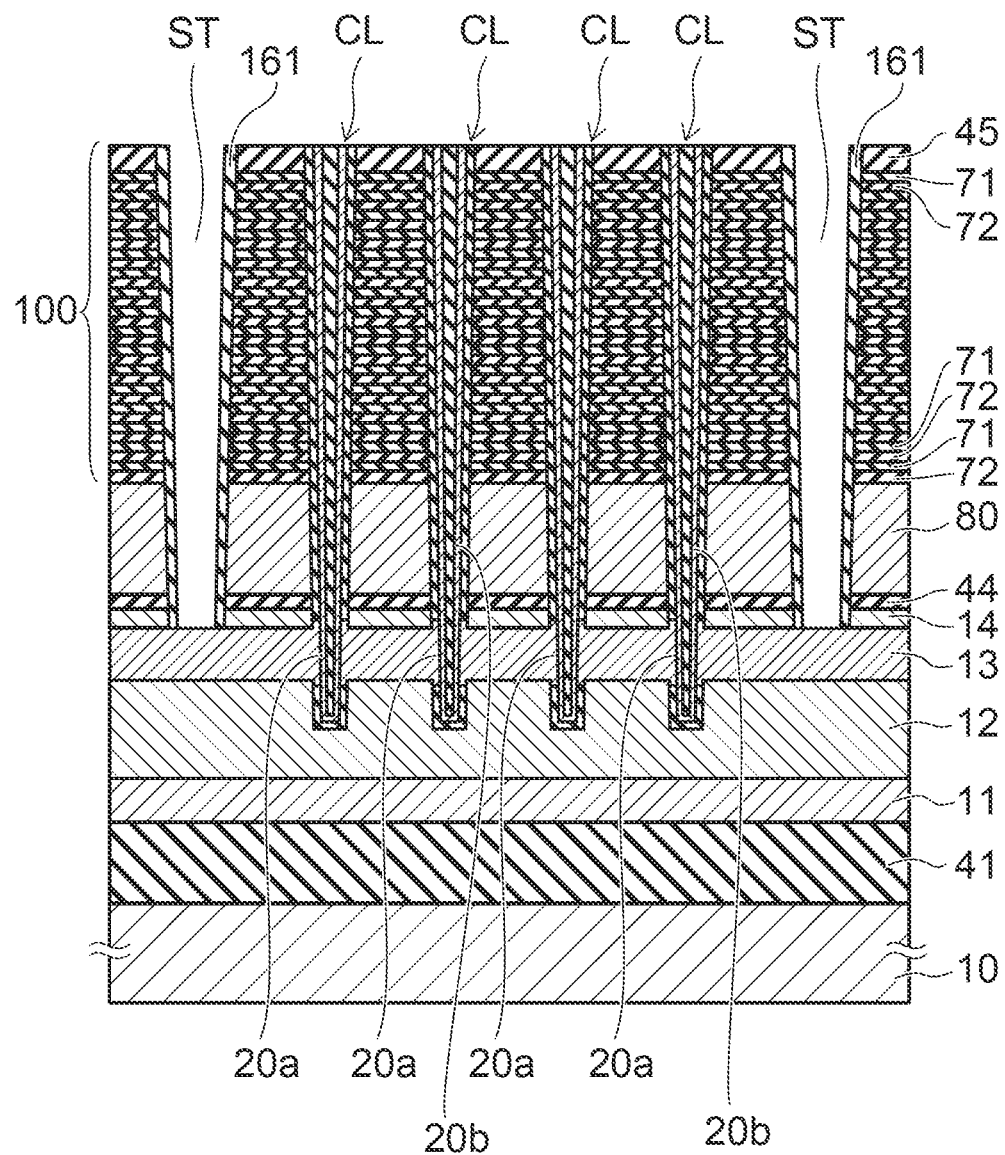

As shown in FIG. 15, the semiconductor layer (the third semiconductor layer) 13 is formed inside the air gap 90. The semiconductor layer 13 is, for example, a polycrystalline silicon layer doped with phosphorus.

A gas that includes silicon is supplied to the air gap 90 through the slits ST; the semiconductor layer 13 is epitaxially grown from the upper surface of the semiconductor layer 12, the lower surface of the semiconductor layer 14, and the side wall portion 20a of the semiconductor body 20 exposed in the air gap 90. The semiconductor layer 13 is buried in the air gap 90.

Because the semiconductor layer 14 which is a polycrystalline silicon layer is formed also on the upper surface of the air gap 90, the epitaxial growth of the semiconductor layer 13 also can be performed from the upper surface side of the air gap 90; and a reduction of the time necessary to form the semiconductor layer 13 is realized.

The side wall portion 20a of the semiconductor body 20 contacts the semiconductor layer 13. At the stage where the columnar portion CL is formed, the semiconductor body 20 substantially does not include an impurity from the upper end to the lower end. The semiconductor layer 13 is epitaxially grown by high-temperature heat treatment; and the impurity (e.g., phosphorus) is doped also into the side wall portion 20a of the semiconductor body 20 at this time.

The impurity (the phosphorus) also is thermally diffused in the extension direction of the semiconductor body 20 from the side wall portion 20a by the heat treatment of the epitaxial growth of the semiconductor layer 13 or heat treatment in a subsequent process. The impurity is diffused to at least the portion of the semiconductor body 20 opposing the insulating layer 44. The impurity is diffused to the region where channel induction by the gate layer 80 is difficult.

As described above, the gate layer 80 performs the role of an absorption layer of the etching rate difference when forming the memory holes MH and the slits ST. Accordingly, it is unnecessary to set the semiconductor layer 14 to be thick. Therefore, the distance of diffusing the impurity from the side wall portion 20a of the semiconductor body 20 to the portion opposing the insulating layer 44 can be set to be short. For example, the diffusion distance is about 50 nm; and the impurity can be diffused easily and reliably into the portion of the semiconductor body 20 opposing the insulating layer 44.

If the impurity is diffused to the portion 20b of the semiconductor body 20 opposing the gate layer 80, as described above, the holes due to GIDL are generated in the portion 20b; and an erase operation that utilizes these holes is possible.

Then, the sacrificial layers 71 are removed using an etchant or an etching gas supplied through the slits ST after removing the liner film 161 or in the same process as the removal of the liner film 161. For example, the sacrificial layers 71 which are silicon nitride layers are removed using an etchant including phosphoric acid.

Figure 16:
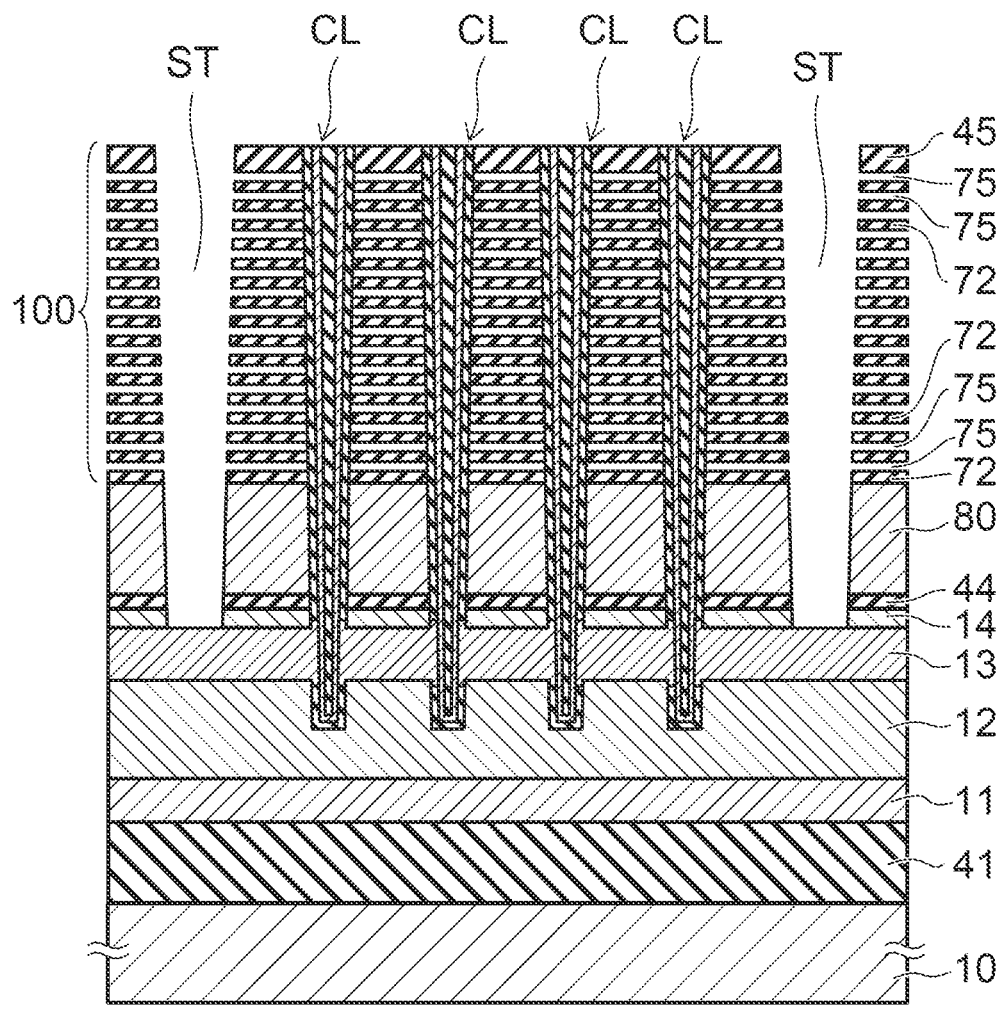

The sacrificial layers 71 are removed; and air gaps 75 are formed between the insulating layers 72 adjacent to each other above and below as shown in FIG. 16. The air gap 75 is formed also between the insulating layer 45 and the insulating layer 72 of the uppermost layer.

The multiple insulating layers 72 contact the side surfaces of the columnar portions CL to surround the side surfaces of the multiple columnar portions CL. The multiple insulating layers 72 are supported by such a physical bond with the multiple columnar portions CL; and the air gaps 75 between the insulating layers 72 are maintained.

Figure 17:
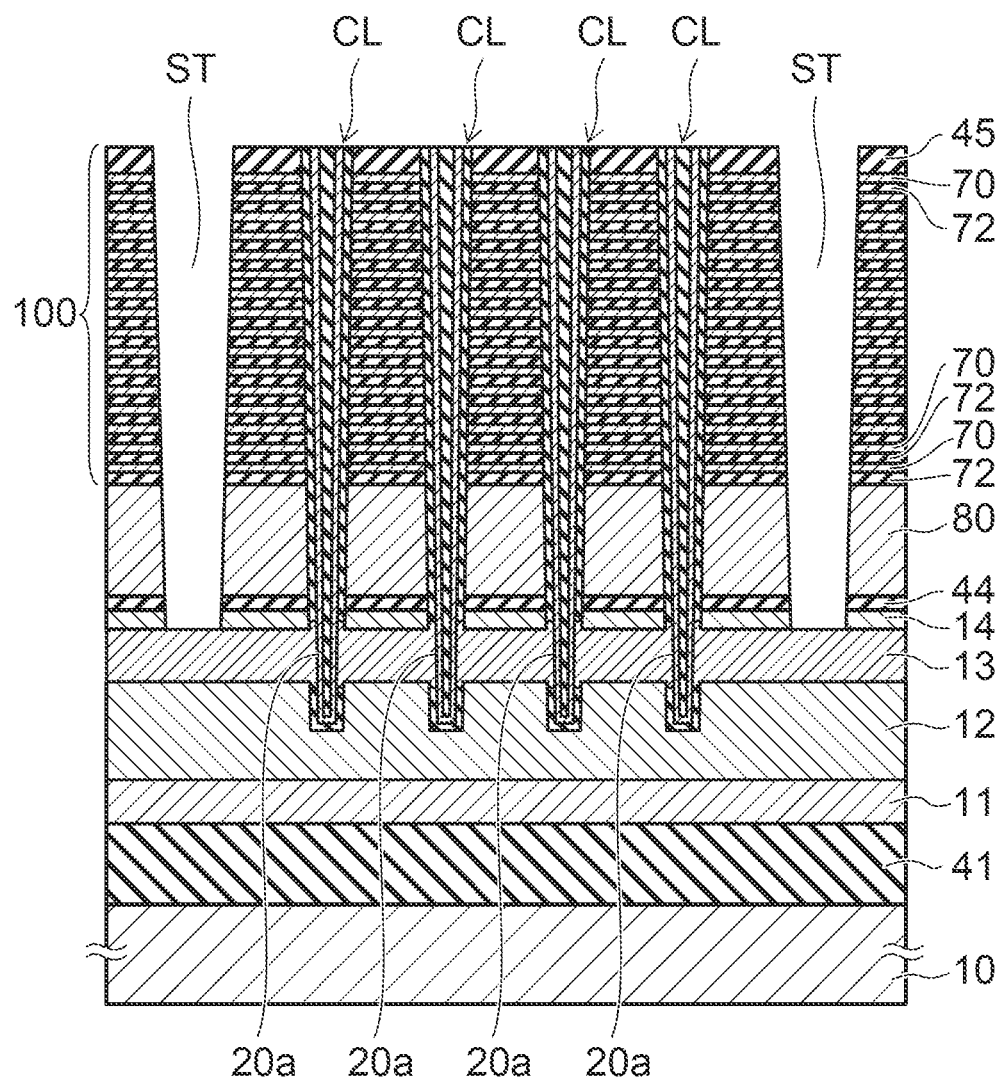

As shown in FIG. 17, the electrode layers 70 are formed in the air gaps 75. For example, the electrode layers 70 are formed by CVD (chemical vapor deposition). A source gas is supplied to the air gaps 75 through the slits ST. The electrode layers 70 formed on the side surfaces of the slits ST are removed.

Subsequently, as shown in FIG. 2, the insulating film 163 is buried into the slits ST.

The sacrificial layer 91 is not limited to a polycrystalline silicon layer and may be, for example, a silicon nitride layer. The protective films 42 and 43 may not be provided in the case of a combination of the sacrificial layer 91 which is a silicon nitride layer and the semiconductor layers 12 and 14 which are polycrystalline silicon layers.

Figure 18:
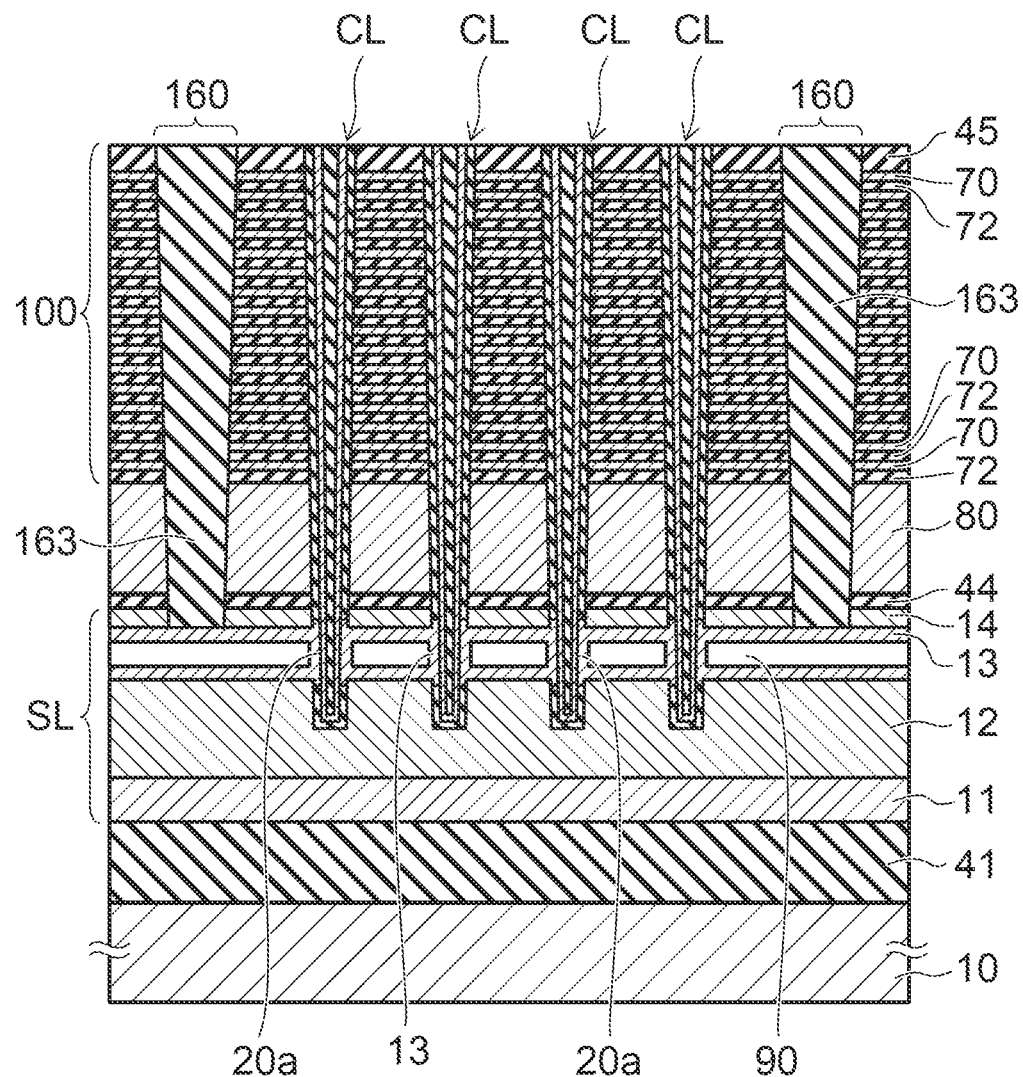
FIG. 18 is a schematic cross-sectional view of the semiconductor device of the embodiment.

FIG. 18 is a schematic cross-sectional view showing another example of the memory cell array of the embodiment.

The semiconductor layer 13 is provided along the upper surface of the semiconductor layer 12, the lower surface of the semiconductor layer 14, and the side wall portion 20a of the semiconductor body 20; and the air gap 90 remains between the semiconductor layer 13 provided on the upper surface of the semiconductor layer 12 and the semiconductor layer 13 provided on the lower surface of the semiconductor layer 14.

If the semiconductor layer 13 is buried in the air gap 90 in an insufficient state and a void occurs inside the semiconductor layer 13, movement of the void in a subsequent high-temperature heat treatment process may cause an electrical disconnection of the side wall portion 20a of the semiconductor body 20.

As in FIG. 18, voids that can move do not exist if the semiconductor layer 13 is formed as a thin film along the upper surface of the semiconductor layer 12, the lower surface of the semiconductor layer 14, and the side wall portion 20a of the semiconductor body 20 and the air gap 90 remains on the inner side of the semiconductor layer 13.

A control circuit controlling the memory cell array 1 may be provided at a surface of the substrate 10 under the memory cell array 1.

Or the control circuit may be provided at a periphery of the memory cell array 1.

Figure 19:
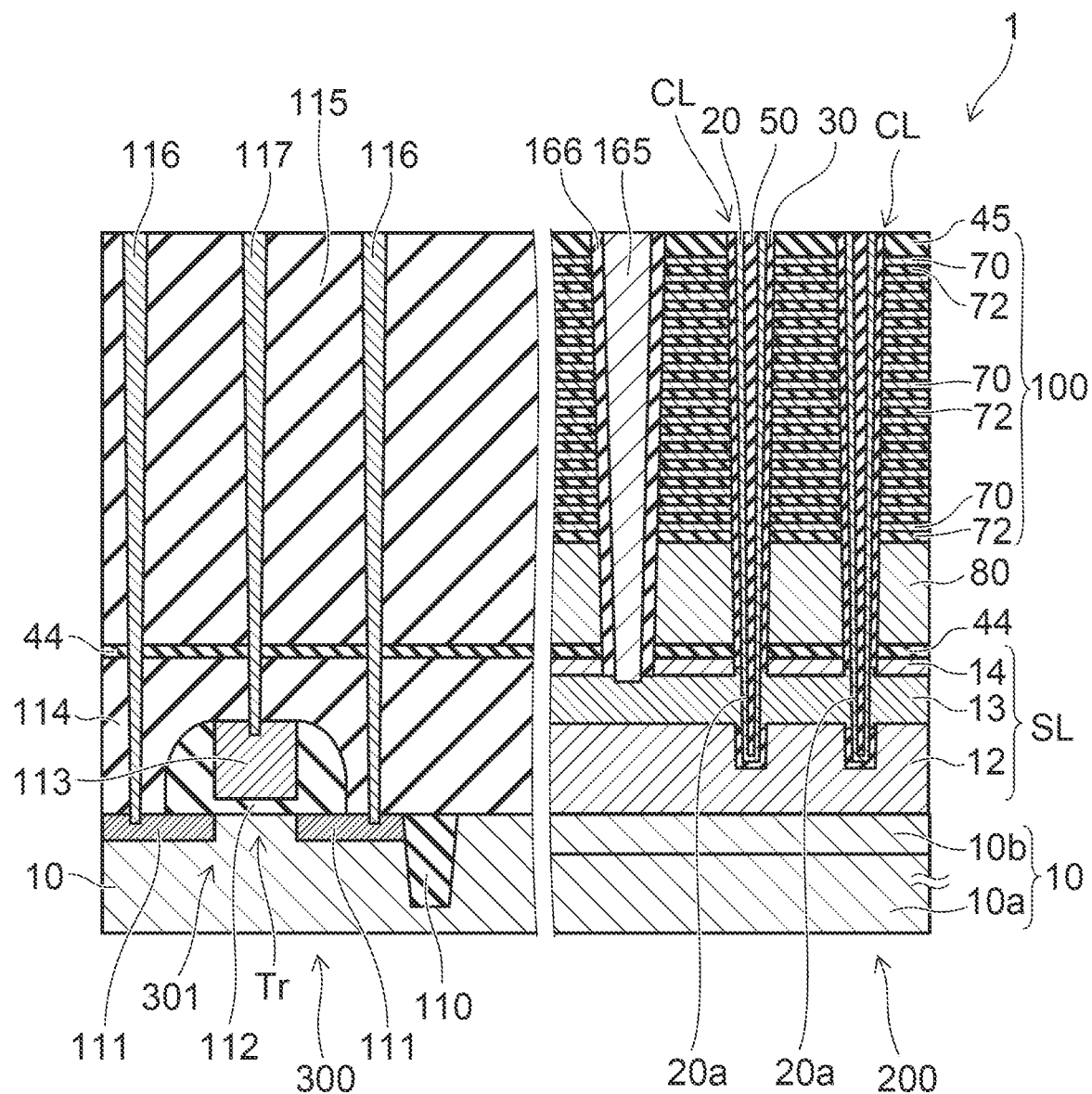
FIG. 19 to FIG. 21 are schematic cross-sectional views of a semiconductor device of another embodiment.

FIG. 19 is a schematic cross-sectional view a cell region 200 and a peripheral region 300. The memory cell array 1 is provided in the cell region 200. A control circuit 301 is provided in the peripheral region 300.

An isolation portion 110 is provided in the substrate 10 in the peripheral region 300. The control circuit 301 is provided, for example, in a region surrounded by the isolation portion 110.

The control circuit 301 includes a plurality of transistors Tr. The transistor Tr includes a source/drain region 111, a gate electrode 113, and a gate insulating film 112. The source/drain region 111 is formed in the surface of the substrate 10. The gate insulating film 112 is provided between the gate electrode 113 and the surface of the substrate 1.

An insulating layer 114 is provided on the substrate 1 so as to cover the gate electrode 113. An insulating layer 115 is provided on the insulating layer 114. An upper surface of the insulating layer 115 and an upper surface of the stacked body 100 are planarized with approximately the same height.

Contact vias 116,117 pierces the insulating layer 115 and the insulating layer 114. The contact via 116 reaches the source/drain region 111, and the contact via 117 reaches the gate electrode 113.

The substrate 10 in the cell region 200 includes a p-type semiconductor region 10a and an n-type semiconductor region 10b provided on the p-type semiconductor region 10a. The p-type semiconductor region 10a is, for example, a silicon region doped with boron. The n-type semiconductor region 10b is, for example, a silicon region doped with phosphorus.

The source layer SL is provided on the substrate 10 in the cell region 200 without an insulating layer interposed between the substrate 10 and the source layer SL. For example, the source layer SL does not contain a metal. The semiconductor layer (for example, an n-type polycrystalline silicon layer doped with phosphorus) 12 of the source layer SL contacts the n-type semiconductor region 10b of the substrate 10.

As in the above embodiment, the side wall portion 20a of the semiconductor body 20 contacts the semiconductor layer (for example, an n-type polycrystalline silicon layer doped with phosphorus) 13.

The insulating layer 114 in the peripheral region 300 is formed also on the substrate 10 in the cell region 200, and then, the insulating layer 114 in the cell region 200 is removed by etching. The source layer SL is formed in a space generated by removal of the insulating layer 114 in the cell region 200.

Such a structure can lower the height of the upper surface of the stacked body 100 as compared with a structure in which the source layer SL, the gate layer 80, and the stacked body 100 are provided on the insulating layer 114 remaining in the cell region 200 and not removed. Thus, the height of the surface of the insulating layer 115 in the peripheral region 300 can be lowered. This reduces the aspect ratios of the contact holes for forming the contact vias 116,117 in the peripheral region 300, and makes it possible to shorten the time of RIE for forming the contact hole.

Increasing the thickness of the n-type semiconductor region 10b of the substrate 10 can lower the resistance of the source layer SL.

The p-type semiconductor region 10a and the n-type semiconductor region 10b of the substrate 10 form a p-n junction. The source layer SL and the control circuit 301 are not electrically connected through the substrate 10 by the reverse voltage applied to the p-n junction in driving the device.

After the process shown in the above FIG. 17, a conductive material 165 may be formed in the slit ST. After an insulating film 166 is formed on the side wall of the slit ST, the conductive material 165 is buried in the slit ST. A lower end portion of the conductive material 165 contacts the semiconductor layer 13 of the source layer SL. An upper end portion of the conductive material 165 contacts an upper interconnect layer (for example, source layer SL) not shown.

The conductive material 165 provided in the slit ST is formed in a plate shape. Or the conductive material 165 may be formed in a columnar shape.

Figure 20:
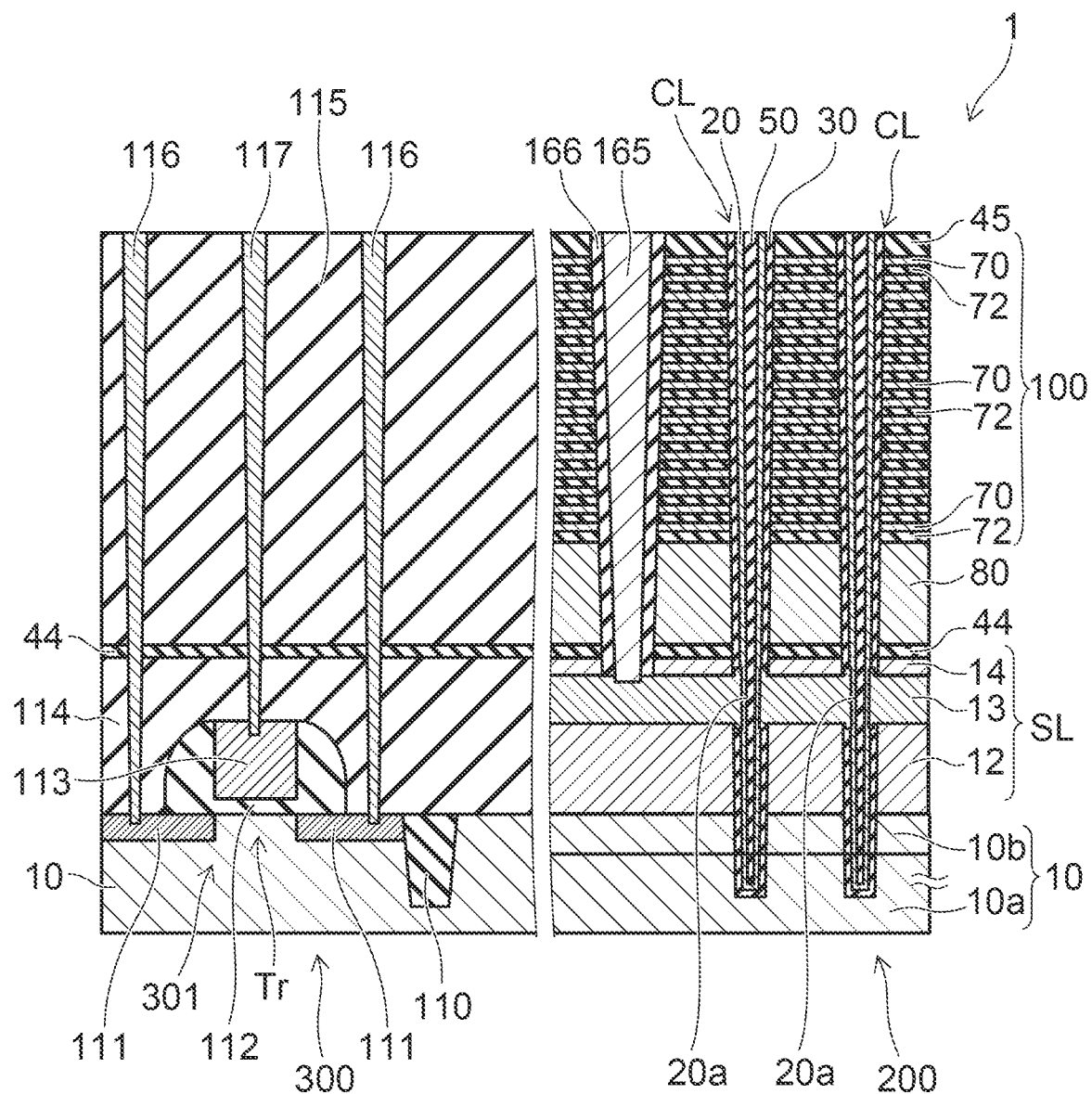

As shown in FIG. 20, the lower end portion of the columnar portion CL may be reached into the substrate 10. The memory hole MH for forming the columnar portion CL pierces the source layer SL and reaches the substrate 10. In this example, the depth control of the memory hole MH is not required. Thus, the etching selectivity between a material of the sacrificial layer 71 and the insulating layer 72, and a silicon can be lower than the example of FIG. 19. This provides more options of etching gas. Thus, the etching rate for forming the memory hole MH can be higher, and the throughput can be improved.

Figure 21:
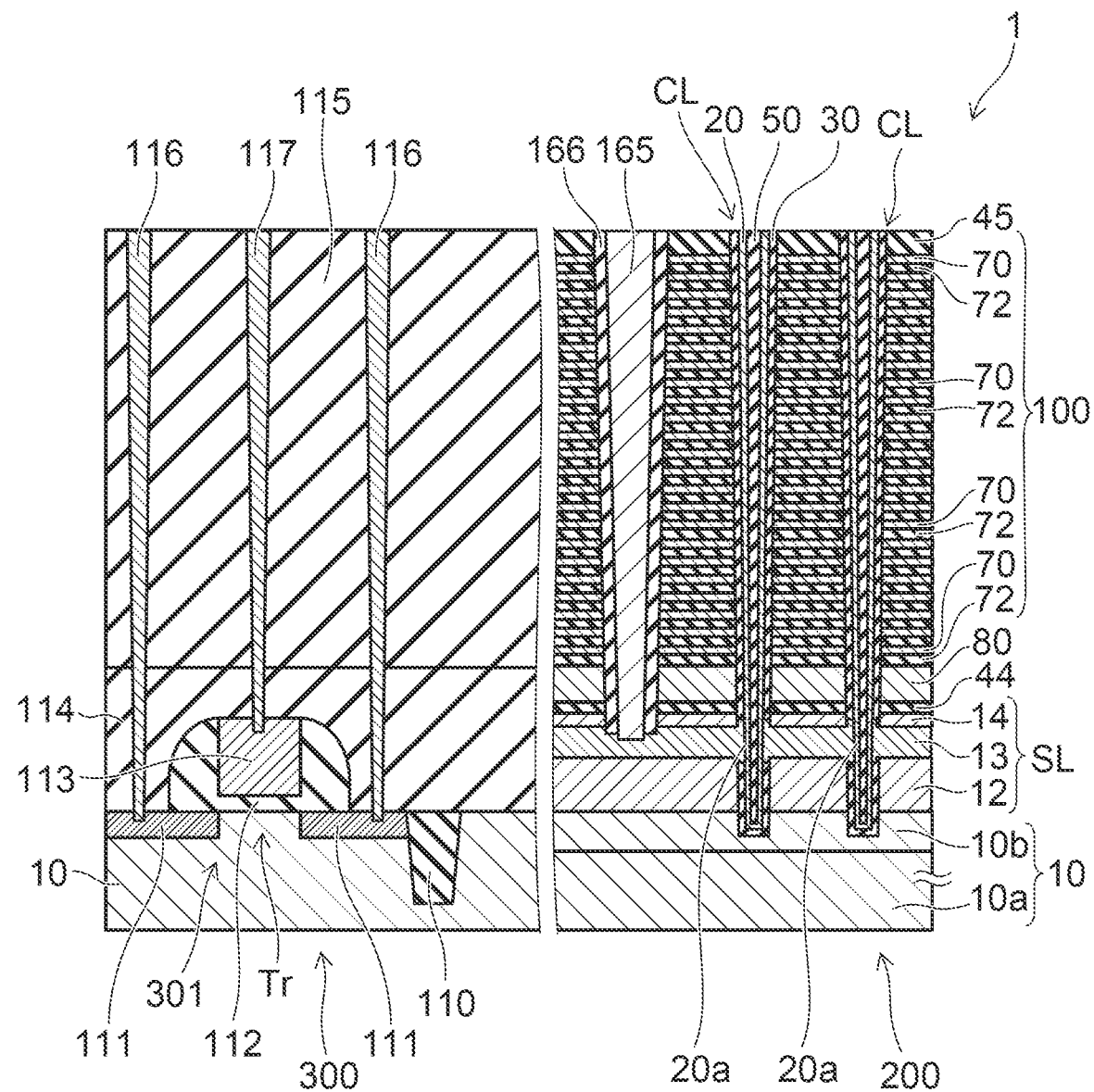

As previously described, the insulating layer 114 in the peripheral region 300 is temporarily formed on the substrate 10 in the cell region 200, and then the insulating layer 114 in the cell region 200 is removed by etching. As shown in FIG. 21, in addition to the source layer SL, the gate layer 80 may be also formed in the space generated by removal of the insulating layer 114 in the cell region 200. The height of the upper surface of the gate layer 80 is approximately the same level as the height of the upper surface of the insulating layer 114 in the peripheral region 300. Such a structure further reduces the height of the stacked body 100 as compared with the structure of FIGS. 19 and 20. Therefore, the etching time of the contact holes for the contact vias 116,117 can be further shortened.

At the RIE of the multiple sacrificial layers 71 and the multiple insulating layers 72 for forming the memory hole MH, the gate layer 80 is easily charged positively by ion, the substrate 10 is easily charged negatively by plasma. This generates a bias between the gate layer 80 and the substrate 10. The bias may cause arcing between the gate layer 80 and the substrate 10.

Figure 22:
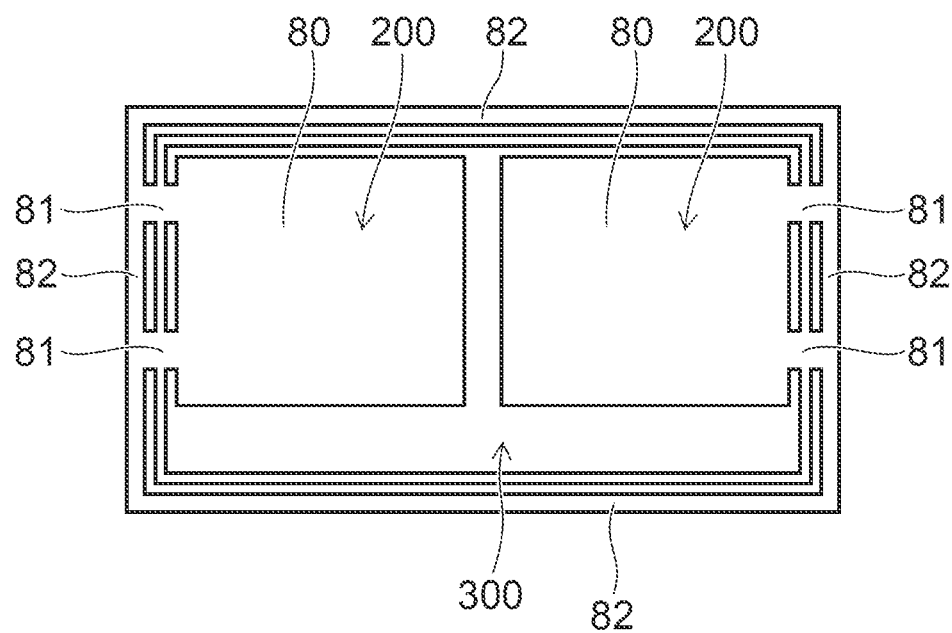
FIG. 22 is a schematic view showing a plane pattern of a gate layer of the other embodiment.

As shown in FIG. 22, a conductive pattern 82 is formed at a kerf portion of a chip periphery. A connection 81 connects the conductive pattern 82 and the gate layer 80 in the cell region 200 each other. This structure can discharge the positive charge charged in the gate layer 80.

The connection 81 and the conductive pattern 82 are formed in the same layer as the gate layer 80. The connection and the conductive pattern 82 are made of the same material (for example polycrystalline silicon) as a material of the gate layer 80. After RIE of the memory hole MH, the connection 81 is divided, and thus the gate layer 80 and the conductive pattern 82 are electrically separated.

Figure 23:
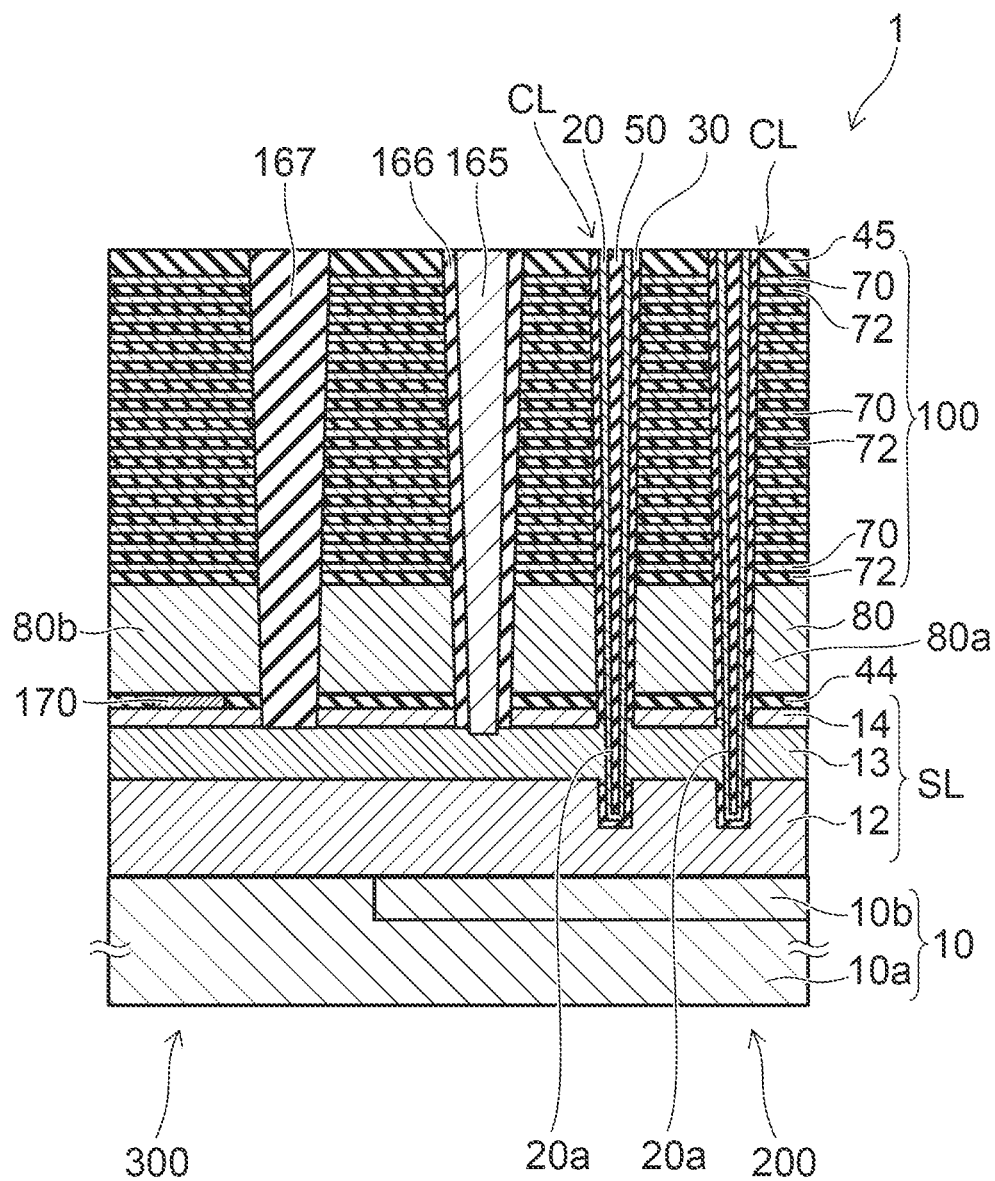
FIG. 23 is a schematic cross-sectional view of the semiconductor device of the other embodiment.

Or, as shown in FIG. 23, the gate layer 80 and the source layer SL may be connected each other by a plug 170. The plug 170 is provided between the peripheral portion 80b of the gate layer 80 and the source layer SL. The plug 170 electrically connects the gate layer 80 and the source layer SL. The plug 170 and the peripheral portion 80b of the gate layer 80 are provided in the peripheral region 300.

The source layer SL contacts the substrate 10. Therefore, the positive charge charged in the gate layer 80 is discharged into the substrate 10 through the plug 170 and the source layer SL. It is not necessary to form the conductive pattern connected to the gate layer 80 in the kerf portion.

After RIE of the memory hole MH, a separation portion 167 is formed. The separation portion 167 electrically separates a cell portion 80a of the gate layer 80 from the source layer SL. The separation portion 167 separates the gate layer 80 into the cell portion 80a and the peripheral portion 80b. The cell portion 80a of the gate layer 80 is provided at the cell region 200. The multiple columnar portions CL pierce the cell portion 80a.

Although a silicon nitride layer is illustrated as the first layer 71 in the embodiment recited above, a metal layer or a silicon layer doped with an impurity may be used as the first layer 71. In such a case, the first layer 71 is used as the electrode layer 70 as-is; and the process of replacing the first layer 71 with the electrode layer is unnecessary.

By removing the second layer 72 by etching through the slits ST, the second layer 72 may be an air gap between the electrode layers 70 adjacent to each other above and below.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
    a first semiconductor layer;
    a stacked body provided above the first semiconductor layer, the stacked body including a plurality of electrode layers stacked in a first direction; and
    a columnar portion including a second semiconductor layer and a charge storage film, wherein
    the second semiconductor layer extends through the stacked body and reaches the first semiconductor layer in the first direction and includes a side wall portion in contact with the first semiconductor layer,
    the charge storage film includes a first portion between the plurality of electrode layers and the second semiconductor layer, and a second portion between the second semiconductor layer and the first semiconductor layer,
    the first portion and the second portion are completely separated from each other in the first direction by the first semiconductor layer, and
    the side wall portion of the second semiconductor layer is not covered with the charge storage film,
    an impurity concentration of the side wall portion of the second semiconductor layer is higher than an impurity concentration of a portion of the second semiconductor layer opposing the stacked body.

2. The semiconductor device according to claim 1, wherein the first semiconductor layer includes an impurity.

3. The semiconductor device according to claim 1, further comprising a gate layer provided between the first semiconductor layer and the stacked body, the gate layer being thicker than a thickness of one layer of the plurality of electrode layers.

4. The semiconductor device according to claim 3, wherein a distance between the side wall portion and a portion of the second semiconductor layer opposing the gate layer is less than a thickness of the gate layer.

5. The semiconductor device according to claim 3, wherein an impurity concentration of a first portion of the second semiconductor layer opposing the gate layer is higher than an impurity concentration of a second portion of the second semiconductor layer opposing the stacked body.

6. The semiconductor device according to claim 3, wherein
    the plurality of electrode layers include:
    at least one first electrode layers functioning as at least one selection gates and each being thinner than the gate layer;
    at least one second electrode layers functioning as at least one selection gates, provided between the at least one first electrode layers and the gate layer, and each being thinner than the gate layer; and
    a plurality of third electrode layers functioning as a plurality of cell Rates, provided between the at least one first electrode layers and the at least one second electrode layers, and each being thinner than the gate layer.

7. The semiconductor device according to claim 3, wherein the gate layer is a silicon layer including phosphorus.

8. The semiconductor device according to claim 1, wherein the first semiconductor layer is a silicon layer including phosphorus.

9. The semiconductor device according to claim 3, further comprising a layer including a metal, the first semiconductor layer being provided between the gate layer and the layer including the metal.

10. The semiconductor device according to claim 1, wherein the charge storage film is continuous in the first direction between the stacked body and the second semiconductor layer.

11. The semiconductor device according to claim 3, wherein the charge storage film is provided between the gate layer and the second semiconductor layer.

12. The semiconductor device according to claim 3, wherein a portion of the second semiconductor layer opposing the gate layer includes an impurity so that the gate layer generates gate induced leakage in an erase operation.

13. The semiconductor device according to claim 1, wherein an air gap is formed in the first semiconductor layer.

14. The semiconductor device according to claim 1, further comprising a substrate, the first semiconductor layer being provided between the substrate and the stacked body layer, the first semiconductor layer contacting the substrate.

15. The semiconductor device according to claim 14, wherein
the substrate includes
an n-type semiconductor region contacting the first semiconductor layer, and
a p-type semiconductor region, the n-type semiconductor region and the p-type semiconductor region forming a p-n junction.

16. The semiconductor device according to claim 14, wherein the second semiconductor layer pierces the first semiconductor layer, and a lower end portion of the second semiconductor layer reaches the substrate.

\* \* \* \* \*